(12) United States Patent
Iwatake et al.

(10) Patent No.: US 11,353,372 B2
(45) Date of Patent: Jun. 7, 2022

(54) DISPLACEMENT DETECTION TYPE FORCE SENSOR

(71) Applicant: Fanuc Corporation, Yamanashi (JP)

(72) Inventors: Takahiro Iwatake, Yamanashi (JP); Shunichi Odaka, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 607 days.

(21) Appl. No.: 16/407,741

(22) Filed: May 9, 2019

(65) Prior Publication Data

US 2019/0360879 A1 Nov. 28, 2019

(30) Foreign Application Priority Data

May 28, 2018 (JP) .............................. JP2018-101480

(51) Int. Cl.
*G01L 1/14* (2006.01)
*H05K 1/18* (2006.01)

(52) U.S. Cl.
CPC .............. *G01L 1/142* (2013.01); *H05K 1/181* (2013.01); *H05K 2201/10151* (2013.01)

(58) Field of Classification Search
CPC ................... G01L 1/142; H05K 1/181; H05K 2201/10151
USPC ..................................................... 73/862.041
See application file for complete search history.

(56) References Cited

U.S. PATENT DOCUMENTS

| 5,905,202 | A | * | 5/1999 | Kubena | G01P 15/131 |
| | | | | | 73/504.15 |
| 6,928,872 | B2 | * | 8/2005 | Durante | G01C 19/5719 |
| | | | | | 73/504.04 |
| 7,360,422 | B2 | * | 4/2008 | Madni | G01C 19/56 |
| | | | | | 73/504.12 |
| 8,434,364 | B2 | * | 5/2013 | Cazzaniga | G01P 15/125 |
| | | | | | 73/514.32 |
| 9,726,587 | B2 | * | 8/2017 | Pagani | G01N 3/08 |
| 2004/0187593 | A1 | | 9/2004 | Okada | |
| 2006/0086190 | A1 | | 4/2006 | Ohsato et al. | |
| 2006/0169060 | A1 | * | 8/2006 | Okada | G01L 5/165 |
| | | | | | 73/862.043 |
| 2011/0005338 | A1 | * | 1/2011 | Okada | G01L 5/0061 |
| | | | | | 73/862.043 |
| 2018/0099421 | A1 | | 4/2018 | Ogata | |
| 2019/0162612 | A1 | | 5/2019 | Sakano et al. | |
| 2019/0162613 | A1 | | 5/2019 | Sakano et al. | |

FOREIGN PATENT DOCUMENTS

| EP | 1739401 B1 | 6/2011 |
| JP | 2004-301731 A | 10/2004 |
| JP | 2006-125873 A | 5/2006 |

(Continued)

*Primary Examiner* — Nathaniel T Woodward
(74) *Attorney, Agent, or Firm* — RatnerPrestia

(57) ABSTRACT

A displacement detection type force sensor, having a mechanism for relaxing deformation of a member due to a factor other than an external force. The force sensor has at least one of: a first relaxation part elastically deformable along a plane perpendicular to a first axis, and provided to at least one of a first substrate part, a first connection part, a second substrate part and a second connection part; and a second relaxation part elastically deformable along the first axis, and provided to at least one of the second substrate part, the second connection part, a third substrate part and a third connection part.

11 Claims, 22 Drawing Sheets

(56) References Cited

FOREIGN PATENT DOCUMENTS

| | | |
|---|---|---|
| JP | 4929257 B2 | 5/2012 |
| JP | 5248221 B2 | 7/2013 |
| JP | 5606270 B2 | 10/2014 |
| JP | 2016-070824 A | 5/2016 |
| JP | 6501746 B2 | 4/2019 |
| JP | 6626074 B2 | 12/2019 |
| JP | 6626075 B2 | 12/2019 |

* cited by examiner

DISPLACEMENT DETECTION TYPE FORCE SENSOR

CROSS-REFERENCE TO RELATED APPLICATIONS

This application is a new U.S. Pat. Application that claims benefit of Japanese Patent Application No. 2018-101480, filed May 28, 2018, the disclosure of this application is being incorporated herein by reference in its entirety for all purposes.

BACKGROUND OF THE INVENTION

1. Field of the Invention

The present invention relates to a displacement detection type force sensor.

2. Description of the Related Art

A displacement detection type force sensor is configured to detect, when a force (load) is applied to a sensor body of the sensor, an amount of displacement of the sensor body due to deformation of thereof by the force, and detect the force based on the detected amount of displacement. For example, JP 2004-301731 A discloses a force sensor for detecting an amount of displacement, based on a change in an electrostatic capacitance at a predetermined portion of a sensor body. This force sensor has a box-shaped outer structure and a box-shaped inner structure, wherein side and upper surfaces of the outer structure are opposed to side and upper surfaces of the inner structure, respectively, so as to form a slit between the outer and inner structures. Then, a plurality of sets of electrodes are located at predetermined positions in the slit so that the electrodes of each set are opposed to each other so as to form an electrostatic capacitance therebetween, in each axial direction of an orthogonal coordinate system. When the outer structure is deformed by a force (or load), the shape and dimension of the slit is varied correspondingly, and then the electrostatic capacitance between the electrodes is also changed. Based on the change in electrostatic capacitance, the amount of displacement of the outer structure relative to the inner structure is calculated, and then, based on the calculated amount of displacement, a force component of the force applied to the outer structure in each axial direction and a moment component about each axis can be detected.

JP 2016-070824 A discloses a displacement detection type six-axes force sensor for detecting a force component in each axial direction of an orthogonal coordinate system and a moment component about each axis, wherein respective displacements in six axes are detected by first and second detecting sections, with one detecting section shearing a detection in relation to three degrees of freedom with the other detecting section.

Further, JP 2006-125873 A discloses multi-axis sensor chip and a multi-axis force sensor, for carrying out highly accurate stress detection, wherein a temperature-compensating resistance element is located on a position where it is subject to the same thermal influence as a strain resistance element, and it is not subject to influence of stress.

In a conventional displacement detection type force sensor, a component for detecting an amount of displacement may be deflected or deformed due to a factor other than a force applied to the sensor (e.g., internal heat generation or change in environmental temperature), whereby measurement accuracy of the force sensor may be deteriorated.

SUMMARY OF THE INVENTION

One aspect of the present disclosure is a force sensor, comprising: a first substrate part; a second substrate part positioned separately from the first substrate part; a third substrate part positioned separately from the second substrate part; a first bridge part configured to position the first substrate part; a second bridge part configured to position the second substrate part; a third bridge part configured to position the third substrate part; a first connection part configured to connect the first substrate part to the first bridge part; a second connection part configured to connect the second substrate part to the second bridge part; a third connection part configured to connect the third substrate part to the third bridge part; a first column part configured to connect the first bridge part to the second bridge part; a second column part configured to connect the second bridge part to the third bridge part; a first detection part configured to detect a relative displacement between the first substrate part and the second substrate part; and a second detection part configured to detect a relative displacement between the second substrate part and the third substrate part, wherein at least one of the first substrate part and the first connection part is configured to be elastically deformable, wherein the second column part is configured to be elastically deformable, wherein the first detection part configured to detect a first detection value which varies corresponding to at least one of: relative movement along a first axis between the first substrate part and the second substrate part; and relative rotation about a center axis along a plane perpendicular to the first axis between the first substrate part and the second substrate part, wherein the second detection part configured to detect a second detection value which varies corresponding to at least one of: relative movement along a plane perpendicular to the first axis between the second substrate part and the third substrate part; and relative rotation about a center axis along the first axis between the second substrate part and the third substrate part, and wherein the force sensor comprises at least one of: at least one first relaxation part elastically deformable along a plane perpendicular to the first axis, and provided to at least one of the first substrate part, the first connection part, the second substrate part and the second connection part; and at least one second relaxation part elastically deformable along the first axis, and provided to at least one of the second substrate part, the second connection part, the third substrate part and the third connection part.

BRIEF DESCRIPTION OF THE DRAWINGS

The above and other objects, features and advantages of the present invention will be made more apparent by the following description of the preferred embodiments thereof with reference to the accompanying drawings wherein.

DETAILED DESCRIPTION

Figure 1:
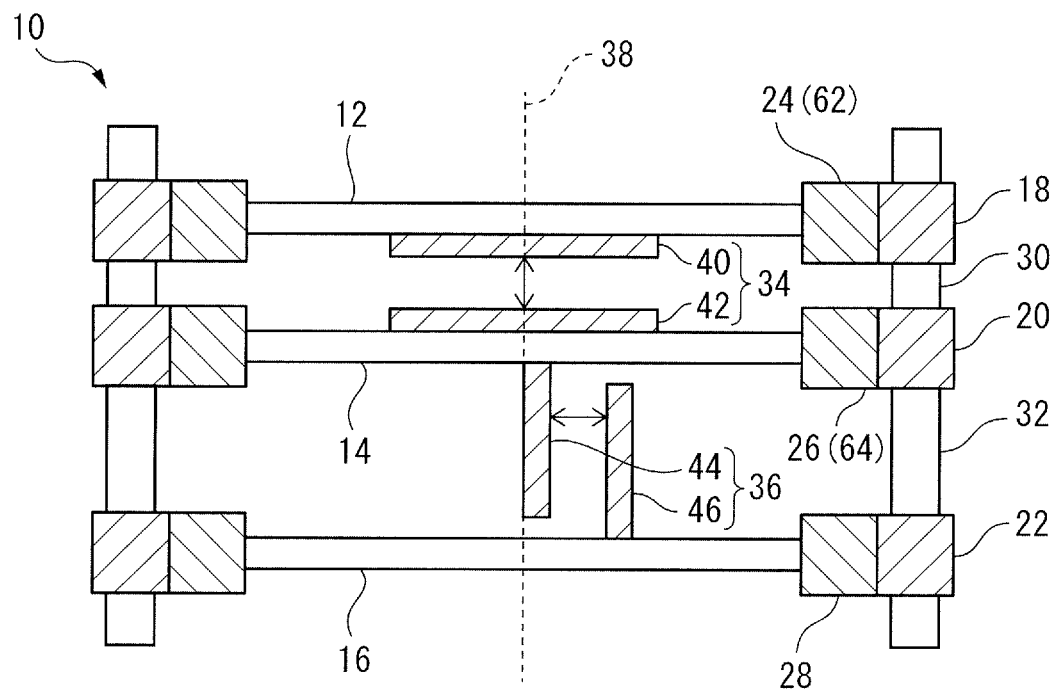
FIG. 1 is a cross-sectional view of a force sensor according to a first embodiment.
Figure 2:
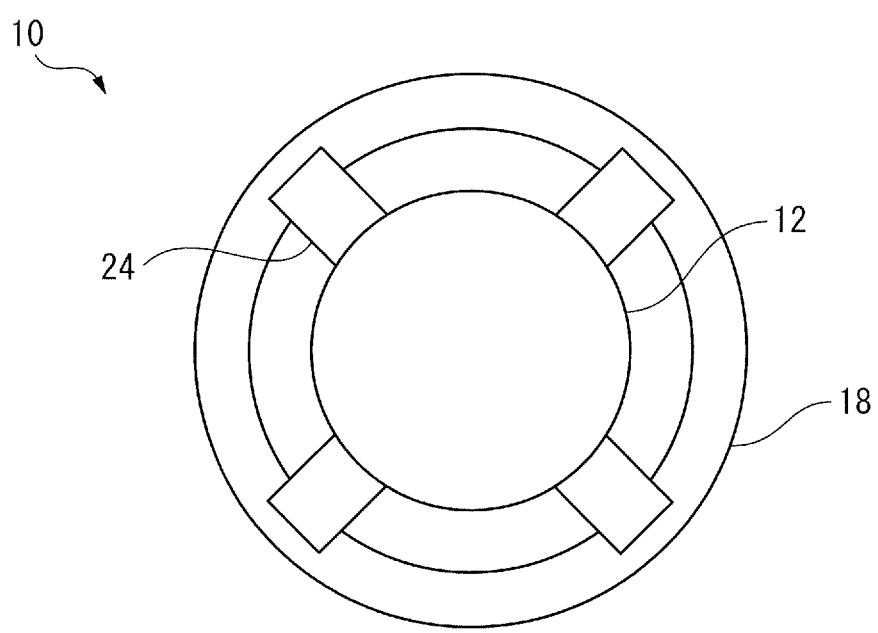
FIG. 2 is a top view of the force sensor of FIG. 1.
Figure 3:
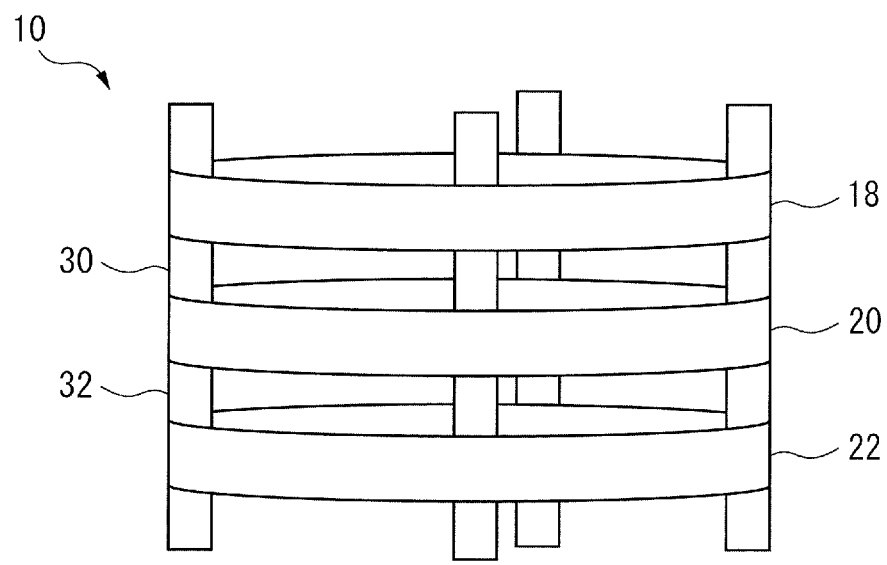
FIG. 3 is a side view of the force sensor of FIG. 1.

FIGS. 1 to 3 are a cross-sectional view, a top view and a side view of a displacement detection type force sensor 10 according to a first embodiment, respectively. For example, force sensor 10 may be used as a six-axis force sensor positioned between a body (e.g., a rotating body) of a robot and an installation surface thereof, or a force sensor attached to a front end of the robot, and is configured to detect a magnitude and a direction of a force applied to the sensor. Force sensor 10 has: a first substrate part 12; a second substrate part 14 positioned separately from first substrate part 12; a third substrate part 16 positioned separately from second substrate part 14; a generally circular first bridge part 18 configured to position first substrate part 12 at a predetermined position; a generally circular second bridge part 20 configured to position second substrate part 14 at a predetermined position; a generally circular third bridge part 22 configured to position third substrate part 16 at a predetermined position; a first connection part 24 configured to connect first substrate part 12 to first bridge part 18; a second connection part 26 configured to connect second substrate part 14 to second bridge part 20; a third connection part 28 configured to connect third substrate part 16 to third bridge part 22; a first column part 30 configured to connect first bridge part 18 to second bridge part 20; a second column part 32 configured to connect second bridge part 20 to third bridge part 22; a first detection part 34 configured to detect a relative displacement between first substrate part 12 and second bridge part 14; and a second detection part 36 configured to detect a relative displacement between second substrate part 14 and third substrate part 16.

For example, first substrate part 12 is attached to first bridge part 18 by using first connection part 24. In this case, when one of the parts is attached to the other part, they may be fastened or fixed to each other by using a bolt, etc. Alternatively, they may be machined or welded so as to be integrated with each other. Further, the parts may have concave and convex shapes on portions thereof to be contacted to each other, respectively, so that they can be precisely positioned. The same is also applicable to the other parts to be combined, and to the other embodiments as explained below.

First substrate part 12 has two or more first connection parts 24 extending along a plane perpendicular to a first axis 38 (extending in the vertical direction in the example of FIG.

1). When an (external) force is applied to force sensor 10, each of first connection parts 24 is elastically deformed so as to generate at least one of: relative movement along first axis 38 between first substrate part 12 and second substrate part 14; and relative rotation about a center axis along a plane perpendicular to first axis 38 between first substrate part 12 and second substrate part 14. In this case, the portion formed by first substrate part 12 and first connection part 24 is elastically deformed, i.e., at least one of first substrate part 12 and first connection part 24 is elastically deformed.

In the first embodiment, force sensor 10 has two or more (e.g., four) first connection parts 24 (FIG. 2), which are positioned so that a straight line extending through a center of two opposed first connection parts 24 is orthogonal to the other straight line (in other words, four first connection parts 24 are positioned at equal angle intervals of 90 degrees in the circumference direction in the top view). Similarly, force sensor 10 has two or more (e.g., four) second connection parts 26 and two or more (e.g., four) third connection parts 28, which are respectively positioned so that a straight line extending through a center of two opposed second or third connection parts 26 or 28 is orthogonal to the other straight line.

Second substrate part 14 has two or more second column parts 32 extending along first axis 38. When the force is applied to force sensor 10, each of second column parts 32 is elastically deformed so as to generate at least one of: relative movement along a plane perpendicular to first axis 38 between second substrate part 14 and third substrate part 16; and relative rotation about a center axis along first axis 38 between second substrate part 14 and third substrate part 16. In addition, third substrate part 16 is connected to second substrate part 14 by using second column part 32.

First detection part 34 has at least one first detection element (electrode in the example of FIG. 1) 40 positioned on first substrate part 12, and at least one second detection element (electrode in the example of FIG. 1) 42 positioned on second substrate part 14 so as to be opposed to first detection element 40. Similarly, second detection part 36 has at least one third detection element (electrode in the example of FIG. 1) 44 positioned on second substrate part 14, and at least one fourth detection element (electrode in the example of FIG. 1) 46 positioned on third substrate part 16 so as to be opposed to third detection element 44. By increasing the number of the first and second detection elements opposed to each other, and by increasing the number of the third and fourth detection elements opposed to each other, degrees of freedom of the detectable force and moment can be increased.

In this embodiment, as explained below, the four first detection elements and the four second detection elements are opposed to each other, and the four third detection elements and the four fourth detection elements are opposed to each other, whereas the present invention is not limited to as such. It is preferable that first substrate part 12, second substrate part 14 and second column part 32 be positioned so that the force applied to force sensor 10 is applied to both first substrate part 12 and second column part 32, without propagating through second substrate part 14. Due to such a configuration and the direction of elastic deformation of the component, the relative displacement between first substrate part 12 and second substrate part 14 and the relative displacement between second substrate part 14 and third substrate part 16 can precisely correspond to three-degrees of force components and moment components of the force applied to force sensor 10, whereby an accuracy of the force sensor can be improved.

Herein, the term "along", etc., means not only on or parallel to the object such as the axis or the plane, but also an appropriate direction. For example, the direction (or axis) along a certain axis or plane may include: a direction (axis) corresponding to or parallel to a reference direction represented by the certain axis or plane; a direction (axis) slightly deviated from the reference direction (i.e., generally parallel to the reference direction); and a direction (axis) intersecting with the reference direction at less than 45 degrees, less than 30 degrees, less than 20 degrees, less than 10 degrees, or less than 5 degrees, etc.

Each of first column part 30 and second column part 32 may have an arbitrary shape, such as a cylinder or a (e.g., quadratic) polygonal prism. Further, the longitudinal length of the column parts, the radial length of the column parts along the longitudinal direction, and the number of the column parts may be arbitrary (e.g., the radial length may be a constant value, may be arbitrary changed along the longitudinal direction, or may be changed depending on a phase (angular position)).

It is preferable that the rigidity of first column part 30 for connecting first bridge part 18 and second bridge part 20 be larger than the rigidity of second column part 32 for connecting second bridge part 20 and third bridge part 22. For example, the rigidity of first column part 30 may be increased by increasing the number of the columns or the diameter of each column, or by substantially integrating first bridge part 18, second bridge part 20 and first column part 30 (see second and third embodiments as explained below). On the other hand, it is preferable that second column part 32 be configured to be elastically deformable. By virtue of this, when the force is applied to force sensor 10 in the direction along the plane perpendicular to first axis 38, the relative displacement between first substrate part 12 and second substrate part 14 in the direction along the plane perpendicular to first axis 38 can be decreased as possible, and the relative displacement between second substrate part 14 and third substrate part 16 in the direction along the plane perpendicular to first axis 38 can be increased as possible.

It is preferable that, a cover configured to cover the entirety of force sensor 10 be arranged around first column part 30 and second column part 32, for the purpose of damp-proofing, dust-proofing, electromagnetic shielding, etc.

Figure 4:
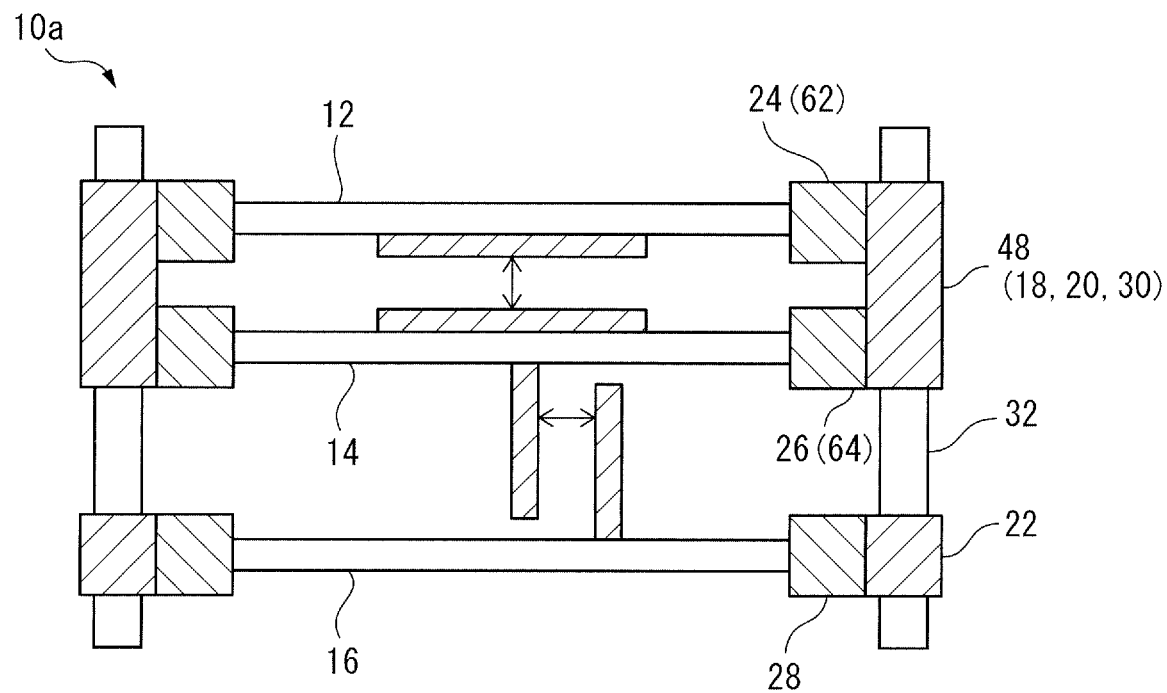
FIG. 4 is a cross-sectional view of a force sensor according to a second embodiment.
Figure 5:
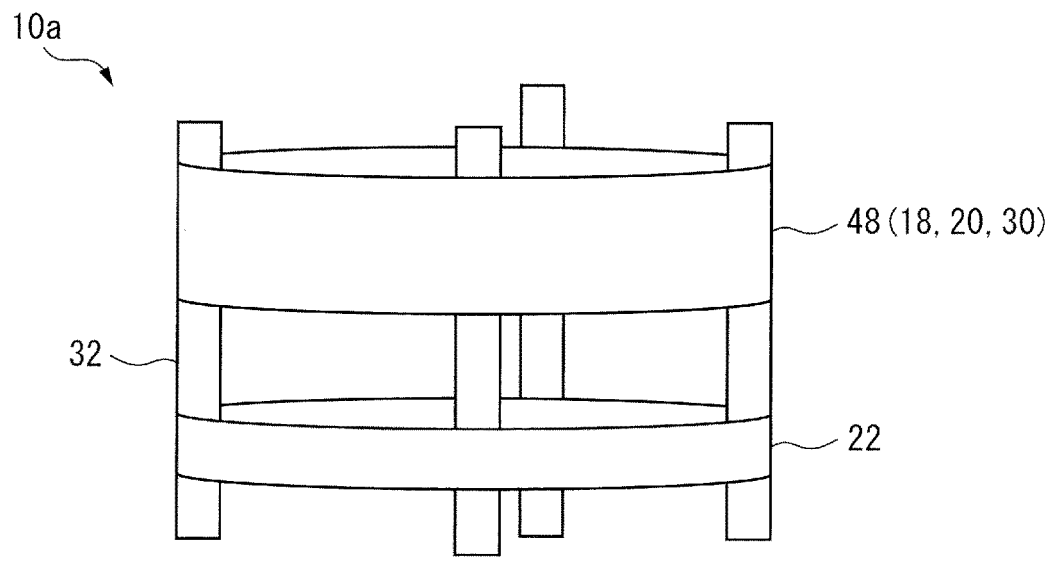
FIG. 5 is a side view of the force sensor of FIG. 4.

FIG. 4 is a cross-sectional view of a force sensor 10*a* according to a second embodiment, and FIG. 5 is a side view of force sensor 10*a*. It is noted that, in the second embodiment, only features different from those of the first embodiment are described, and descriptions regarding other features identical to those of the first embodiment will be omitted.

In the second embodiment, first bridge part 18, second bridge part 20 and first column part 30 are integrated so as to constitute a substantially one member 48. By virtue of such a structure, man-hours and cost for manufacturing the three parts can be reduced, and member 48 can have a higher rigidity than a simple assembly of the three parts. In the second embodiment, first substrate part 12 is attached to member 48 by using first connection part 24, and second substrate part 14 is attached to member 48 by using second connection part 26.

Figure 6:
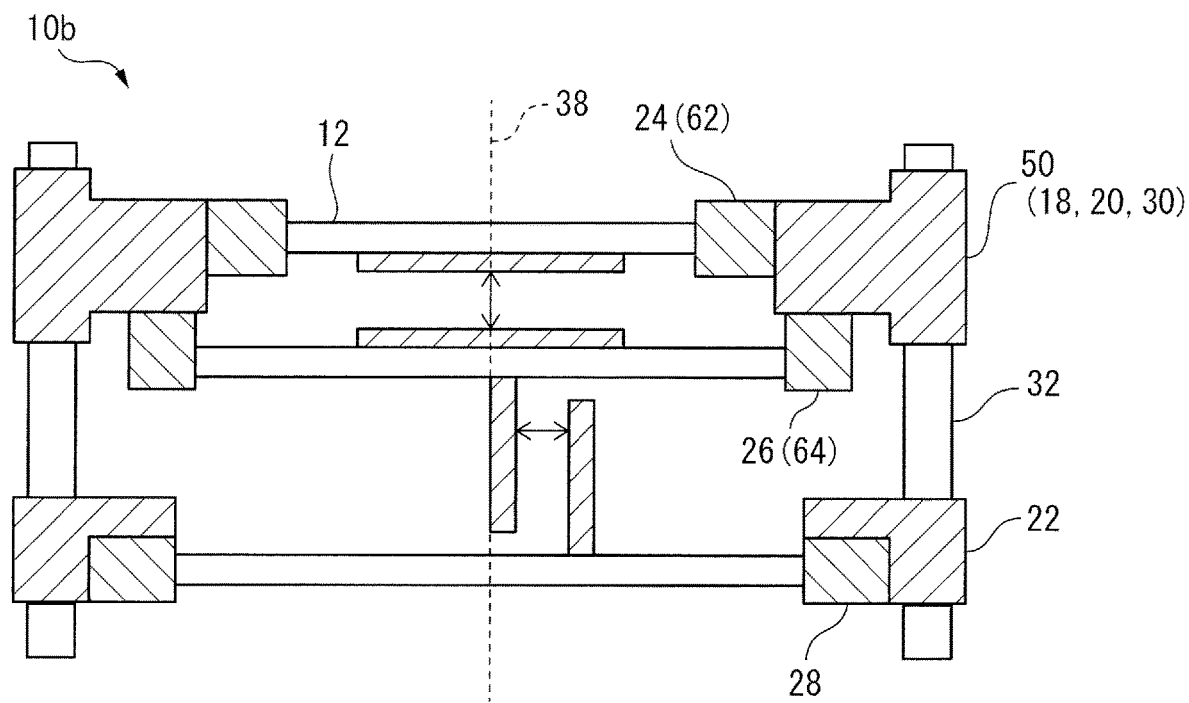
FIG. 6 is a cross-sectional view of a force sensor according to a third embodiment.

FIG. 6 is a cross-sectional view of a force sensor 10*b* according to a third embodiment. It is noted that, in the third embodiment, only features different from those of the first embodiment are described, and descriptions regarding other features identical to those of the first embodiment will be omitted.

In the third embodiment, similarly to the second embodiment, first bridge part 18, second bridge part 20 and first column part 30 are integrated so as to constitute a substantially one member 50. In this regard, second connection part 26 is attached to member 50 along first axis 38 (in the example of FIG. 6, second connection part 26 is attached to a lower surface of member 50). Also, third connection part 28 is attached to third bridge part 22 along first axis 38 (in the example of FIG. 6, third connection part 28 is attached to a lower surface of third bridge part 22). By virtue of such a structure, an effect similar to the second embodiment can be obtained, and each part can be easily assembled. In the third embodiment, first substrate part 12 is attached to member 50 by using first connection part 24, and second substrate part 14 is attached to member 50 by using second connection part 26.

Figure 7:
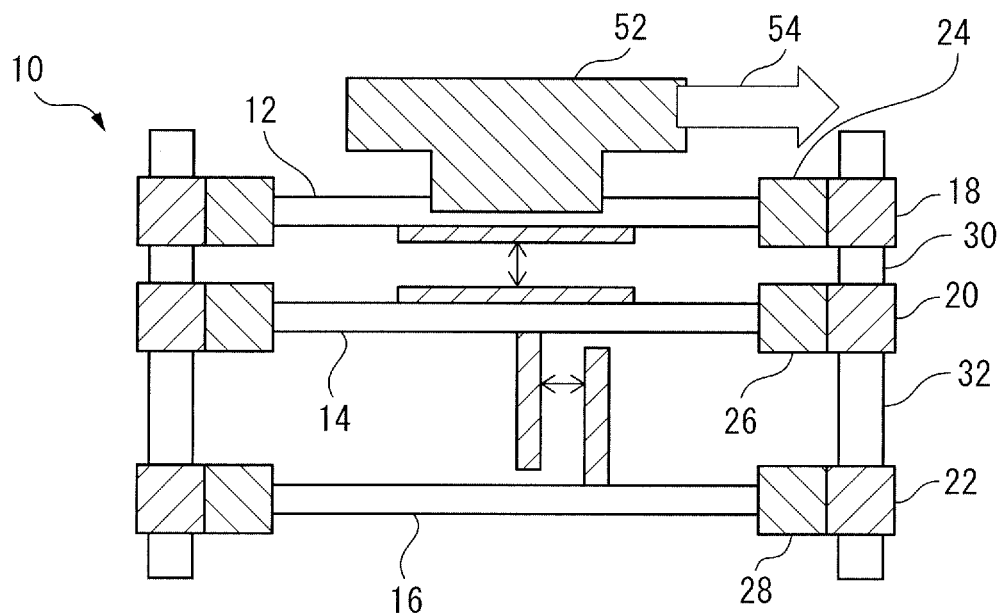
FIG. 7 shows an example in which a force is applied to the force sensor of the first embodiment.
Figure 8:
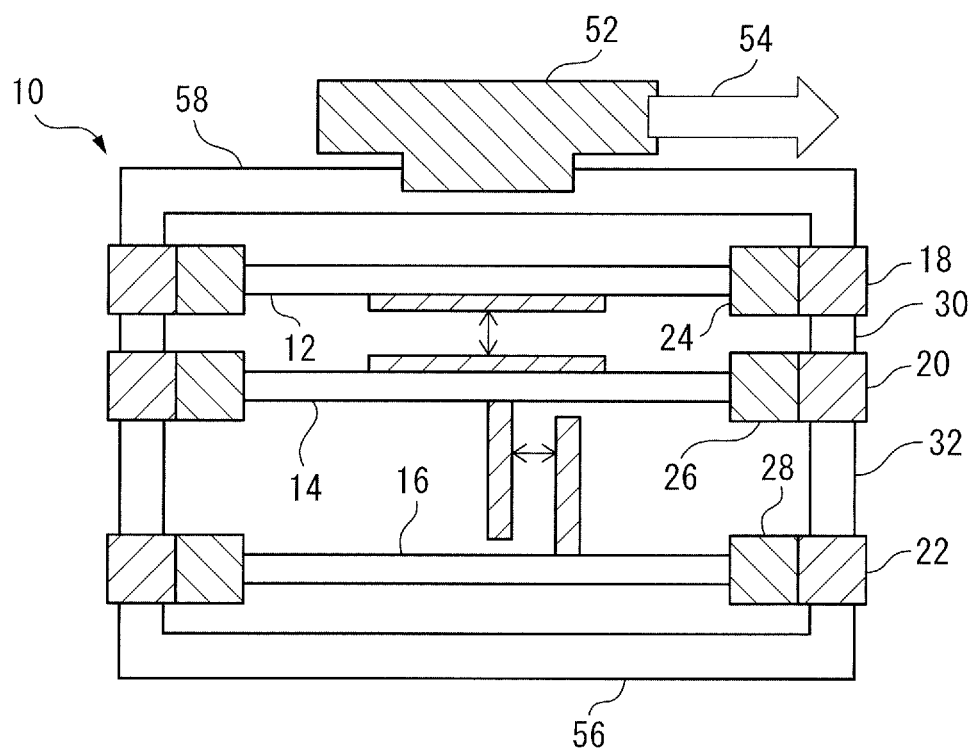
FIG. 8 shows an example in which a force is applied to the force sensor of the first embodiment.

FIGS. 7 to 10 show examples in which the force is applied to force sensor 10 of the first embodiment, which is attached to or installed on an arbitrary object. In FIG. 7, third substrate part 16 may be directly or indirectly fixed as an installed side, and first substrate part 12 (or an unfixed side) may be directly or indirectly (e.g., via an adapter 52) attached to an object to which the force is applied in a direction indicated by an arrow 54, as a force-applied side. In FIG. 8, a (housing) part 56, which is separated from second column part 32 and is connected to third substrate part 16 by using third bridge part 22, may be directly or indirectly fixed as an installed part (or the installed side). Further, a (housing) part 58, which is separated from first column part 30 and is connected to first substrate part 12 by using first bridge part 18, may be directly or indirectly (e.g., via adapter 52) attached to the object to which the force is applied in a direction indicated by arrow 54, as the force-applied side.

Figure 9:
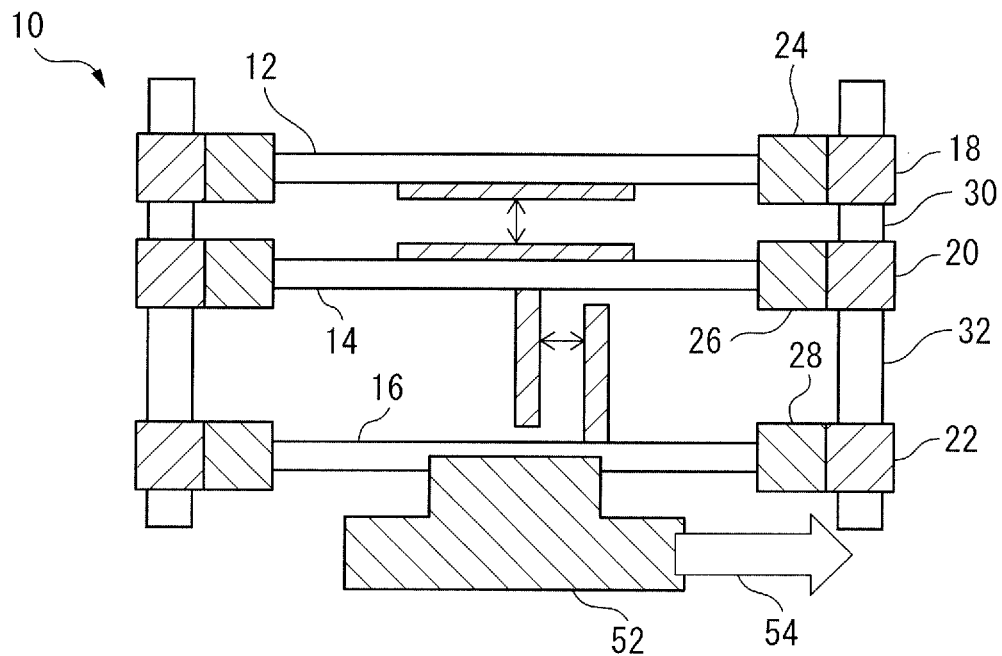
FIG. 9 shows an example in which a force is applied to the force sensor of the first embodiment.
Figure 10:
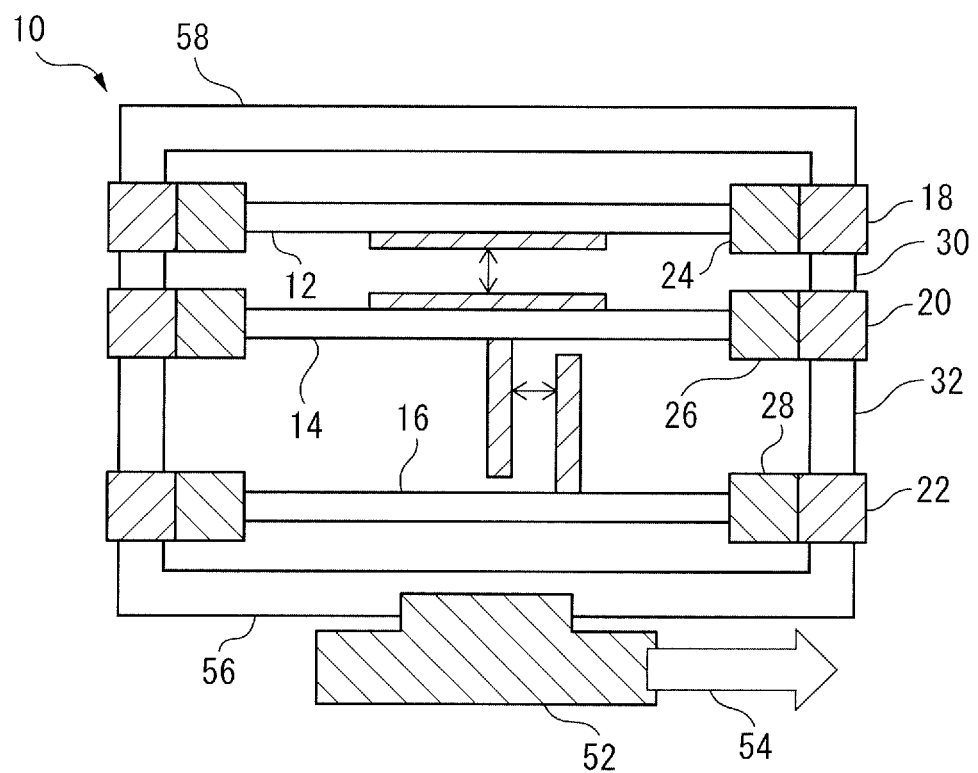
FIG. 10 shows an example in which a force is applied to the force sensor of the first embodiment.

In FIG. 9, first substrate part 12 may be directly or indirectly fixed as the installed side, and third substrate part 16 (or the unfixed side) may be directly or indirectly (e.g., via adapter 52) attached to the object to which the force is applied in the direction indicated by arrow 54, as the force-applied side. In FIG. 10, (housing) part 58, which is separated from first column part 30 and is connected to first substrate part 12 by using first bridge part 18, may be directly or indirectly fixed as the installed part (or the installed side). Further, (housing) part 56, which is separated from second column part 32 and is connected to third substrate part 16 by using third bridge part 22, may be directly or indirectly (e.g., via adapter 52) attached to the object to which the force is applied in a direction indicated by arrow 54, as the force-applied side. In addition, in FIG. 9, it is preferable that first substrate part 12 be fixed via an adapter having an appropriate shape (not shown), since first substrate part 12 on the installed side may be deformed.

First detection part 34 is configured to detect a first detection value which varies corresponding to relative movement along first axis 38 between first substrate part 12 and second substrate part 14, and relative rotation about the center axis along the plane perpendicular to first axis 38 between first substrate part 12 and second substrate part 14. As shown in FIG. 1, first detection part 34 has a first detection element 40 arranged on first substrate part 12, and a second detection element 42 arranged on second substrate part 14. The first detection value detected by first detection part 34 is used to acquire a force component in the direction of first axis 38, a moment component of a force about a second axis orthogonal to first axis 38, and a moment component of a force about a third axis orthogonal to both the first axis and the second axis.

In this embodiment, the first detection value is a value of change in an electrostatic capacitance which varies corresponding to the relative displacement between first substrate part 12 and second substrate part 14. In this case, two (a pair of) electrodes opposed to each other may be arranged as first detection element 40 and second detection element 42, so that the change in the electrostatic capacitance corresponding to a gap between the electrodes can be detected. Alternatively, the first detection value may be an amount of change in a charge quantity, an inductance, a light quantity, an ultrasonic wave or a magnetic quantity, which varies depending on the relative displacement between first substrate part 12 and second substrate part 14. Otherwise, the first detection value may be a value representing a change in a position of a corresponding point on an image, or a value relating to image information, which varies depending on the relative displacement between first substrate part 12 and second substrate part 14.

In this embodiment, first detection part 34 is constituted by a plurality pairs of first detection elements 40 and second detection elements 42 opposed to each other. First detection element 40 and second detection element 42 may have respective electrodes attached thereto, or may be constituted as the electrodes. Further, in the pair of first detection element 40 and second detection element 42, the electrodes having the same shape are opposed to each other. For example, first detection element 40 and second detection element 42 may be electrodes constituted from FPCs (Flexible Printed Circuits).

Figure 11:
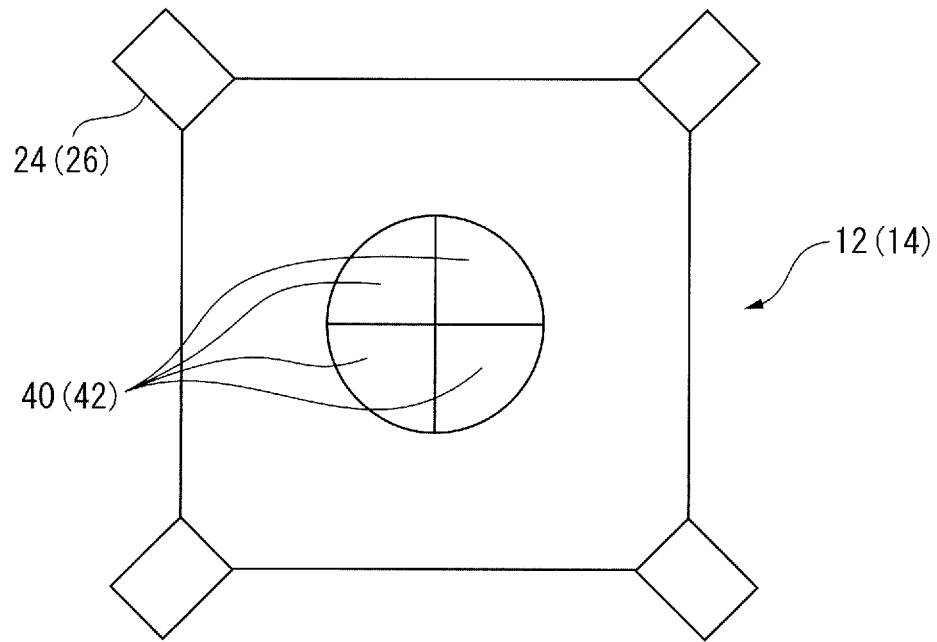
FIG. 11 shows an example of a concrete structure of a first detection part.
Figure 12:
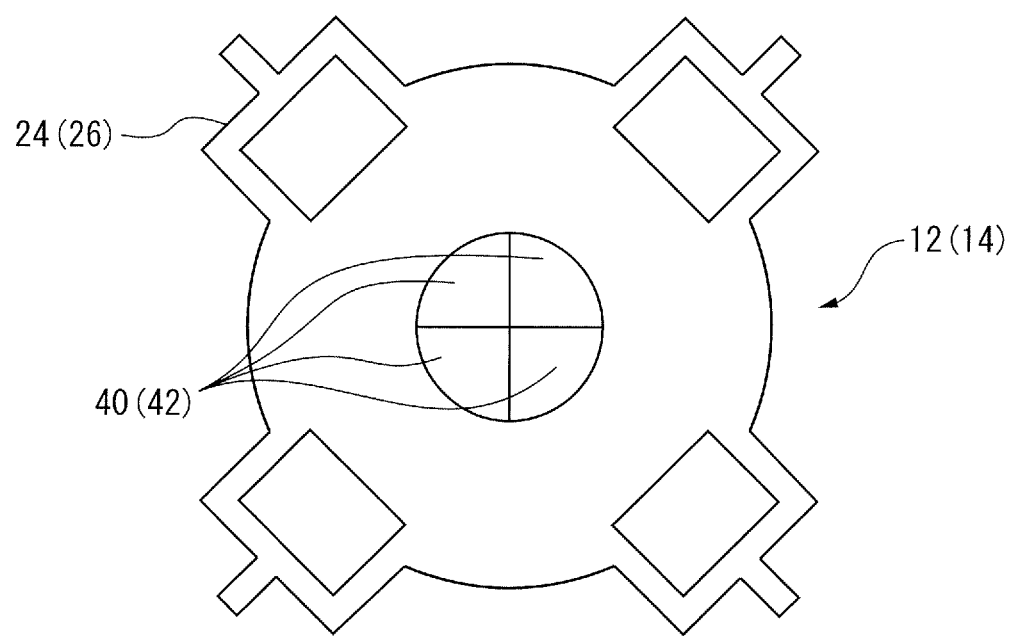
FIG. 12 shows another example of a concrete structure of the first detection part.

As exemplified in FIGS. 11 and 12, plurality of first detection elements 40 are attached to first substrate part 12, and plurality of second detection elements 42 are attached to second substrate part 14. In detail, the shape of the electrode of first detection element 40 may be a sector having a central angle of 90 degrees or less (in the drawing, 90 degrees), and four first detection elements 40 having the same shape are combined so as to form one circle. In other words, plurality of first detection elements 40 each having the sector shape are combined so as to form the circle, and are attached to first substrate part 12.

Similarly to first detection elements 40, the shape of the electrode of second detection element 42 may be a sector having a central angle of 90 degrees or less (in the drawing, 90 degrees), and four second detection elements 42 having the same shape are combined so as to form one circle. In other words, plurality of second detection elements 42 each having the sector shape are combined so as to form the circle, and are attached to second substrate part 14.

Figure 13:
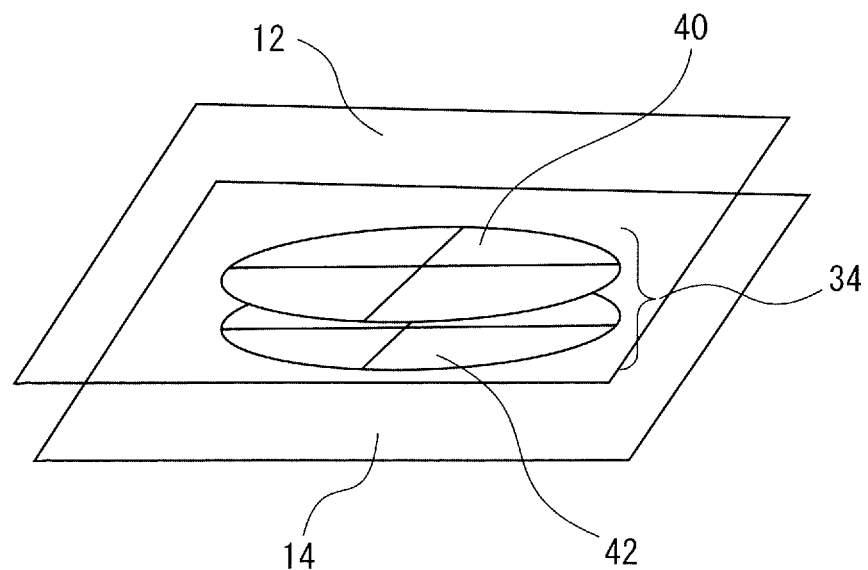
FIG. 13 is a perspective view of an example in which first and second detection elements are opposed to each other.

As shown in FIG. 13, the electrode constituting first detection element 40 and the electrode constituting second detection element 42 are opposed to each other. Concretely, the four electrodes constituting first detection elements 40 and the four electrodes constituting second detection elements 42 are respectively opposed to each other. By virtue of such a configuration, first detection part 34 includes four pairs of first detection elements 40 and second detection elements 42 opposed to each other, whereby four electrostatic capacitance values can be acquired as the first detection values. From the four acquired electrostatic capacitance values, the force component in the direction of first axis 38, the moment component of the force about the second axis orthogonal to first axis 38, and the moment component of the force about the third axis orthogonal to both the first axis and the second axis, can be calculated.

When first detection part 34 is constituted by using the plurality of pairs of first detection elements 40 and second detection elements 42, it is sufficient that the shape of the electrode of first detection elements 40 and the shape of the electrode of second detection elements 42 opposed to each other are the same. Therefore, the electrodes of first detection elements 40 may not be identical to each other. Similarly, the electrodes of second detection elements 42 may not be identical to each other.

Figure 14:
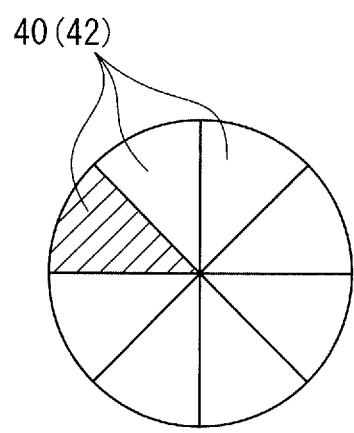
FIG. 14 shows another example of the concrete structure of the first or second detection element.

FIG. 14 exemplifies a configuration in which the number of first detection elements 40 or second detection elements 42 is eight. In this case, eight sector shapes each having a central angle of 45 degrees or less (in the drawing, 45 degrees), which is 90 degrees in the example of FIG. 11 or 12, are combined so as to form one circle. In the example of FIG. 14, since eight electrostatic capacitance values can be acquired as the first detection values, these values can be processed as two sets of data (each set including data corresponding to the four electrostatic capacitance values as explained above), and the data can be used to detect a malfunction of the sensor, and/or improve a detection accuracy of the sensor.

Second detection part 36 is configured to detect a second detection value which varies corresponding to relative movement along the plane perpendicular to first axis 38 between second substrate part 14 and third substrate part 16, and relative rotation about the center axis along first axis 38 between second substrate part 14 and third substrate part 16. As shown in FIG. 1, second detection part 36 has a third detection element 44 arranged on second substrate part 14, and a fourth detection element 46 arranged on third substrate part 16. The second detection value detected by second detection part 36 is used to acquire a force component in the direction of the second axis, a force component in the direction of the third axis, and a moment component of a force about first axis 38.

In this embodiment, the second detection value is a value of change in an electrostatic capacitance which varies corresponding to the relative displacement between second substrate part 14 and third substrate part 16. In this case, two (a pair of) electrodes opposed to each other may be arranged as third detection element 44 and fourth detection element 46, so that the change in the electrostatic capacitance corresponding to a gap between the electrodes can be detected. Second detection part 36 may be constituted as not only one pair of electrodes, but also a plurality pairs of electrodes (see FIG. 18 as explained below). Alternatively, the second detection value may be an amount of change in a charge quantity, an inductance, a light quantity, an ultrasonic wave or a magnetic quantity, which varies depending on the relative displacement between second substrate part 14 and third substrate part 16. Otherwise, the second detection value may be a value representing a change in a position of a corresponding point on an image, or a value relating to image information, which varies depending on the relative displacement between second substrate part 14 and third substrate part 16.

Figure 15:
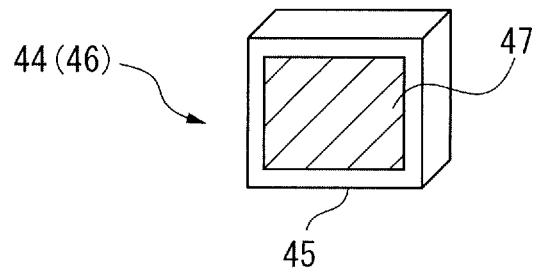
FIG. 15 shows an example of a concrete structure of a third or fourth detection element of a second detection part.

In this embodiment, second detection part 36 is constituted by a plurality pairs of third detection elements 44 and fourth detection elements 46 opposed to each other. Third detection element 44 and fourth detection element 46 may have respective electrodes attached thereto, or may be constituted as the electrodes. Further, in the pair of third detection element 44 and fourth detection element 46, the electrodes having the same shape are opposed to each other. For example, as shown in FIG. 15, third detection element 44 or fourth detection element 46 may be an electrode constituted from a rectangular parallelepiped member 45 to which a FPC (Flexible Printed Circuits) 47 is attached.

Figure 16:
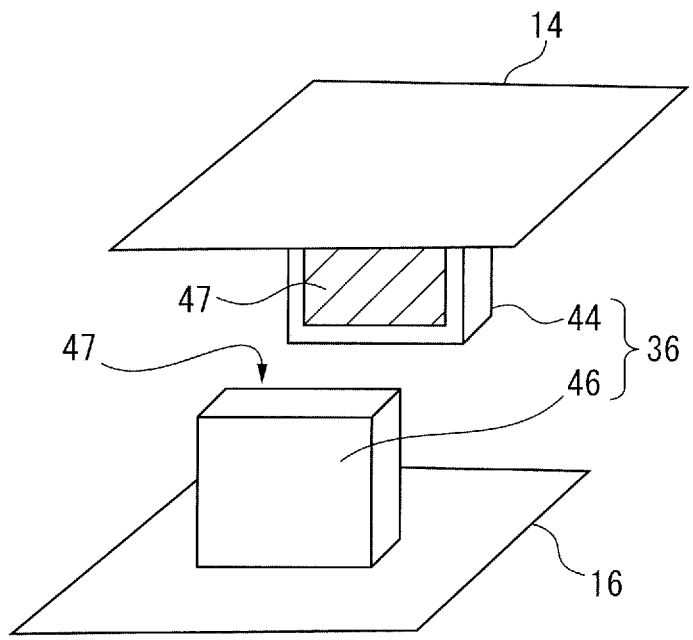
FIG. 16 shows an example of a concrete structure of the second detection part, in which the third and fourth detection elements are not opposed to each other for clarification.
Figure 17:
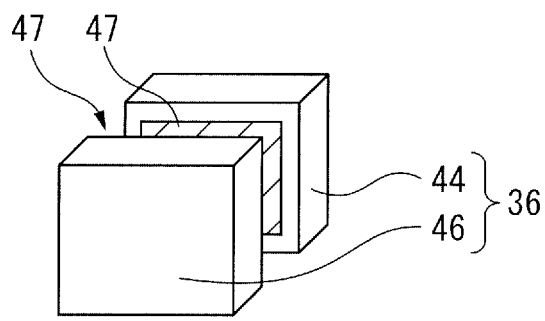
FIG. 17 shows an example of a concrete structure of the second detection part.

FIGS. 16 and 17 show a concrete example of second detection part 36. Plurality of third detection elements (FIG. 16 shows one of them) are attached to second substrate part 14, and plurality of fourth detection elements 46 (FIG. 16 shows one of them) are attached to third substrate part 16. In this regard, FIG. 16 shows that third detection element 44 and fourth detection element 46 are not positioned opposed to each other for clarification. However, in real, as shown in FIG. 17, third detection element 44 and fourth detection element 46 are positioned so that respective electrodes 47 thereof are opposed to each other.

Figure 18:
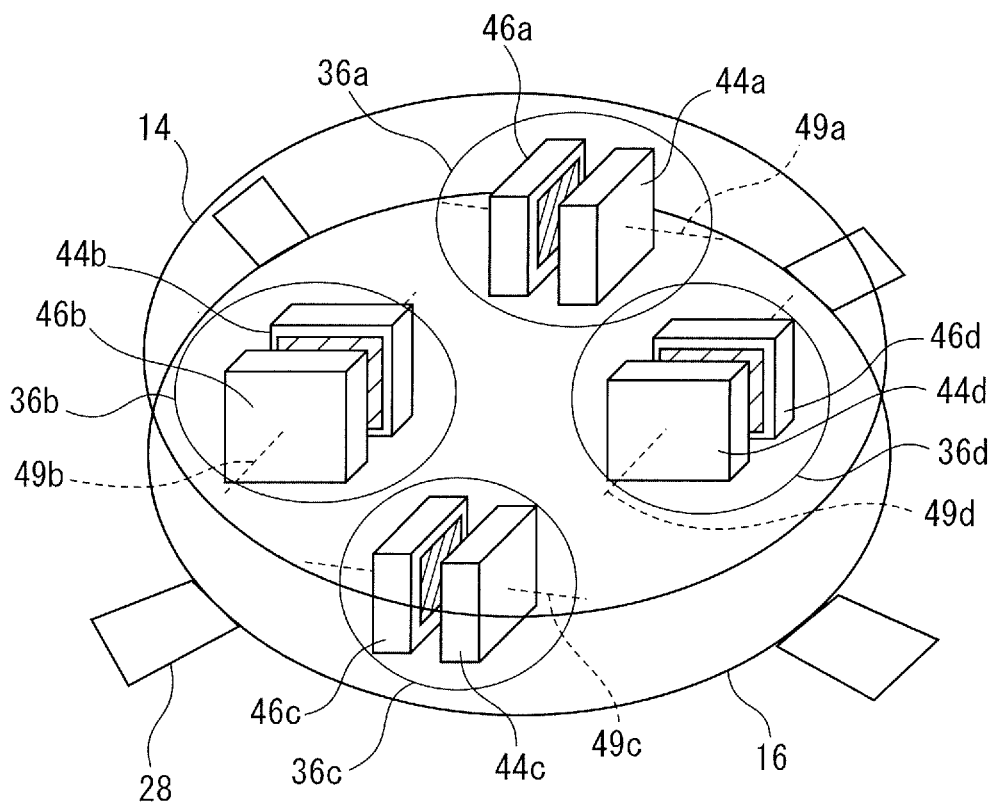
FIG. 18 shows an example of a structure including a plurality of the second detection parts.

FIG. 18 exemplifies a structure including a plurality of the second detection parts. In this structure, each of four third detection elements 44a to 44d is a parallelepiped member to which an electrode is attached, and each of four fourth detection elements 46a to 46d is a parallelepiped member to which an electrode is attached. Then, the electrodes of third detection elements 44a to 44d and the electrodes of fourth detection elements 46a to 46d are respectively opposed to each other, whereby four second detection parts 36a to 36d are constituted. As such, by arranging the plurality of (in the drawing four) sets of opposing electrodes, the plurality of (in this case, four) electrostatic capacitance values can be acquired as the second detection values.

In FIG. 18, a straight line 49a orthogonal to surfaces of the opposing electrodes of third detection element 44a and fourth detection element 46a and a straight line 49c orthogonal to surfaces of the opposing electrodes of third detection element 44c and fourth detection element 46c are parallel to each other. Also, a straight line 49b orthogonal to surfaces of the opposing electrodes of third detection element 44b and fourth detection element 46b and a straight line 49d orthogonal to surfaces of the opposing electrodes of third detection element 44d and fourth detection element 46d are parallel to each other. Further, straight line 49a (49c) and straight line 49b (49d) are perpendicular to each other. By virtue of such a structure, four electrostatic capacitance values can be acquired as the second detection values, and then, based on the acquired four electrostatic capacitance values, the force component in the direction of the second axis orthogonal to first axis 38, the force component in the direction of the third axis orthogonal to both the first axis and the second axis, and the moment component of the force about the first axis can be calculated.

Figure 19:
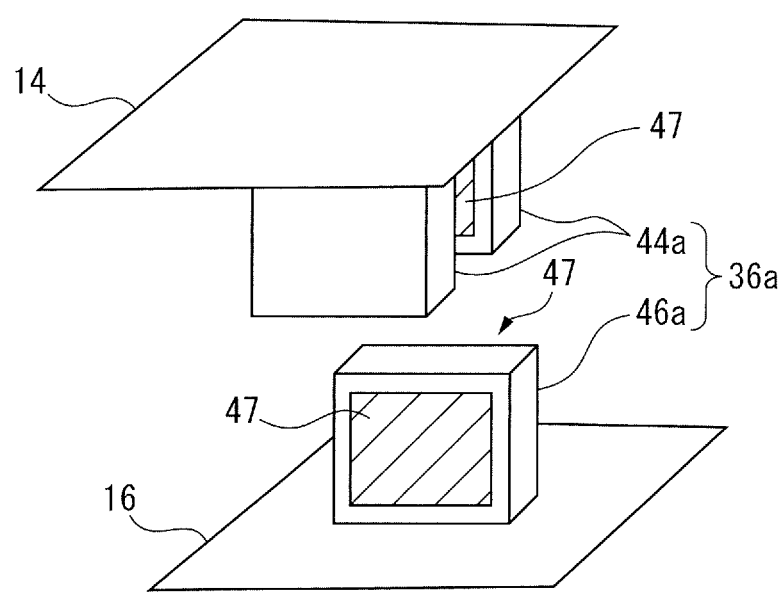
FIG. 19 shows another example of the concrete structure of the second detection part, in which the third and fourth detection elements are not opposed to each other for clarification.
Figure 20:
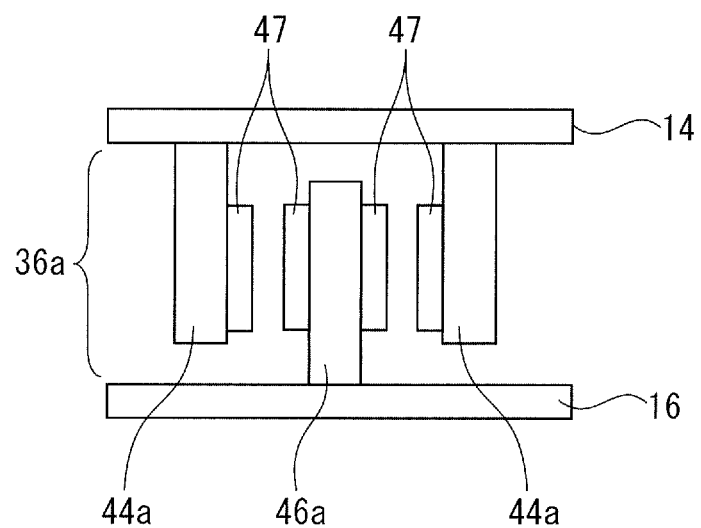
FIG. 20 shows the concrete structure of the second detection part of FIG. 19 viewed from a different angle.
Figure 21:
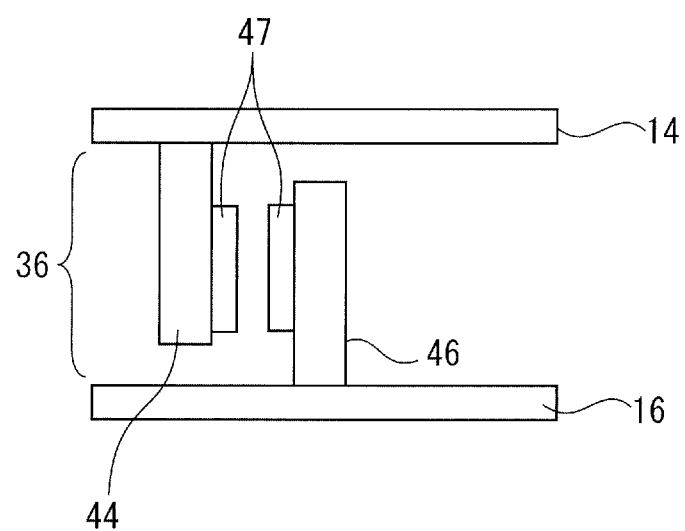
FIG. 21 shows the concrete structure of the second detection part of FIG. 16 viewed from a different angle.

FIGS. 19 and 20 exemplify another structure of the second detection part. For example, second detection part 36a has two third detection elements 44a attached to second substrate part 14, and one fourth detection element 46a attached to third substrate part 16. Fourth detection element 46a has electrodes 47 attached to both surfaces thereof, and each third detection element 44a has electrode 47 opposed to the electrode attached to each surface of fourth detection element 46a. Therefore, second detection part 36a in FIG. 20 has substantially two sets of electrodes, unlike second detection part 36a in FIG. 21 having substantially one set of electrodes. Further, it is preferable that all (four) electrodes are parallel to each other.

Similarly to second detection part 36a, each of second detection parts 36b, 36c and 36d may have substantially two sets of electrodes. In this case, since eight electrostatic capacitance values can be acquired as the second detection values, these values can be processed as two sets of data (each set including data corresponding to the four electrostatic capacitance values as explained above), and the data can be used to detect a malfunction of the sensor, and/or improve a detection accuracy of the sensor.

As explained above, in this embodiment, based on the first detection value(s) acquired by first detection part 34 and the second detection value(s) acquired by second detection part 36 (36a to 36d), the force components in the directions of the three axes orthogonal to each other, and the moment component of the force about each of the three axes, can be calculated.

The detection value acquirement part in the present disclosure is configured to acquire the values detected by first detection part 34 and second detection part 36. For example, the detection value acquirement part may be mounted on a printed circuit board 60 (see FIG. 24 as described below) as a processor, etc. In the embodiment, it is assumed that, when printed circuit board 60 is powered, an inside of the force sensor is heated, whereby the components within the force sensor may be deformed or bent. In this case, when a first relaxation part 62 or a second relaxation part 64 as described below is not provided, the relative displacement between first substrate part 12 and second substrate part 14 and/or the relative displacement between second substrate part 14 and third substrate part 16 may be varied. However, by arranging printed circuit board 60 within the force sensor, the part for acquiring the values detected by first detection part 34 and second detection part 36 can be integrated, whereby a system including the force sensor becomes compact and easy to use, since it is not necessary to arrange another printed circuit board outside the force sensor.

The force calculation part in the present disclosure is configured to, based on the first detection value and the second detection value, calculate the force components in directions of three axes orthogonal to each other, and the moment component of the force about each of the three axes. By mounting the force calculating part (such as a processor) on printed circuit board 60 of the force sensor, the force sensor itself can output force data without using an external control unit, etc. Otherwise, the force calculating part such as a processor may be incorporated in a controller connected to the force sensor.

Figure 22:
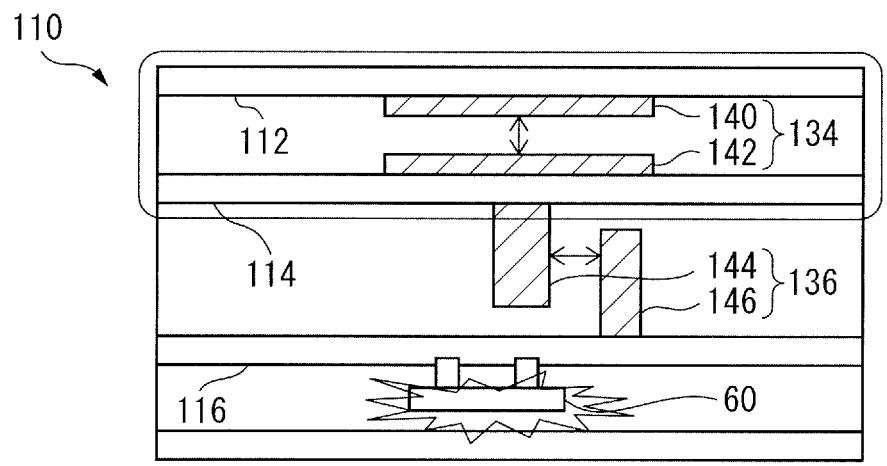
FIG. 22 shows a structural example of a force sensor having no relaxation mechanism, as a comparative example.

FIG. 22 exemplifies a structure of a force sensor 110, as a comparative example of the present disclosure, having no relaxation mechanism. In FIG. 22, each component, substantially corresponding to the component of force sensor 10 in the first embodiment, is indicated by a reference numeral in which 100 is added to the reference numeral of the corresponding component of force sensor 10.

Figure 23:
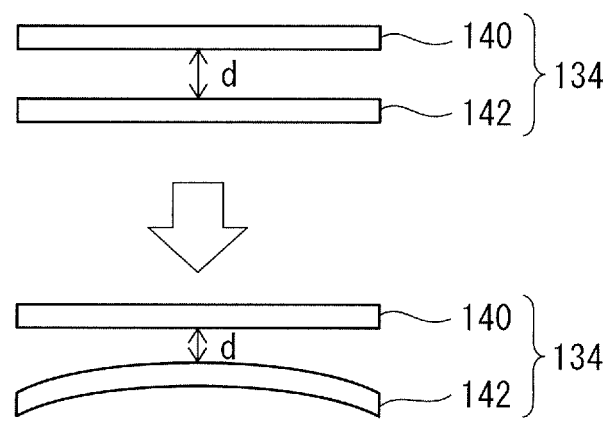
FIG. 23 shows an example in which a distance between electrodes is changed in the force sensor of FIG. 22.

In the structure having no relaxation mechanism, such as force sensor 110, due to a factor (e.g., heat dissipation from a heating element such as printed circuit board 60 within the force sensor) other than the external force applied to the force sensor, a member constituting first detection part 134 or second detection part 136 may be deformed. For example, as shown in FIG. 23, first detection part 134 is constituted by electrodes 140 and 142, and a portion constituted by the second detection element, the second substrate part and the second connection part, to which electrode 142 is attached, may be bent by heat. Then, distance "d" between electrodes 140 and 142 may be changed, whereby the force applied to the force sensor may not be correctly detected.

Therefore, the force sensor has at least one of: a first relaxation part 62 elastically deformable along the plane perpendicular to first axis 38; and a second relaxation part 64 elastically deformable along first axis 38. First relaxation part 62 is elastically deformable along the plane perpendicular to first axis 38, in order to relax or absorb the deformation of the member due to heat within the force sensor. Further, first relaxation part 62 has a relaxation mechanism for facilitating heat transfer and dissipating heat. Therefore, in case that the relative displacement between first substrate part 12 and second substrate part 14 may occur due to the factor (such as internal heat generation) other than the external force applied to the force sensor, an error of the relative displacement between first substrate part 12 and second substrate part 14 detected by first detection part 34 can be reduced, by providing first relaxation part 62 to at least one of first connection part 24, second substrate part 14 and second connection part 26.

Figure 24:
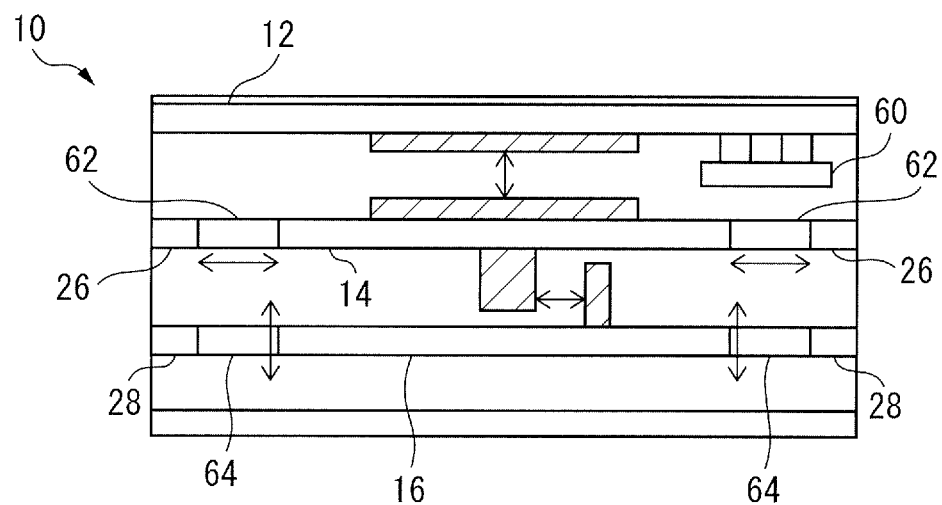
FIG. 24 shows an example in which a relaxation part is provided to the force sensor having a printed circuit board.

For example, as shown in FIG. 24, in case that the relative displacement between first substrate part 12 and second substrate part 14 may occur by the deformation of second substrate part 14 due to heat from the heating element such as printed circuit board 60 within force sensor 10, it is preferable that first relaxation part 62 be provided to second connection part 26.

Figure 25:
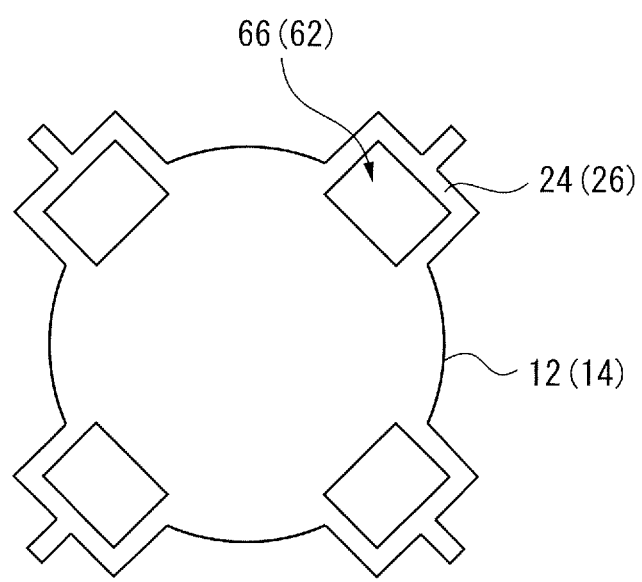
FIG. 25 shows an example of a concrete structure of a first relaxation part.

FIG. 25 shows an example of a concrete structure of first relaxation part 62. When first relaxation part 62 is to be provided to first connection part 24 or second connection part 26, first substrate part 12 or second substrate part 14 can be elastically displaced along the plane perpendicular to first axis 38, by forming one or more hole 66 on first connection part 24 or second connection part 26, as first relaxation part 62.

Figure 26:
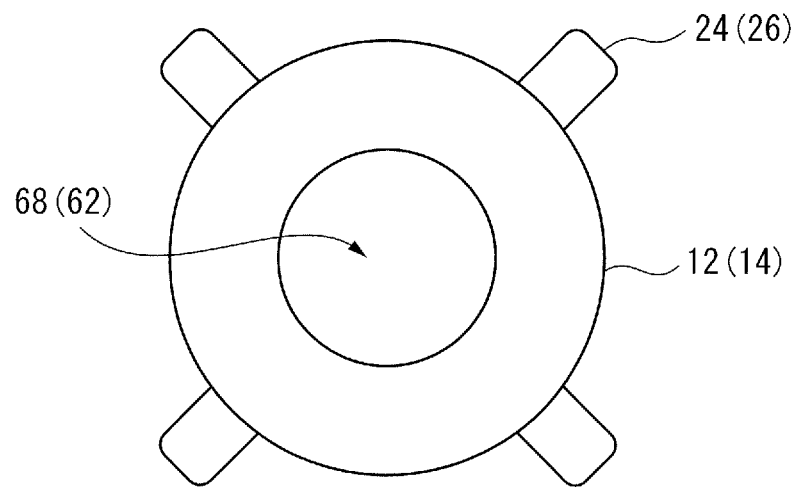
FIG. 26 shows another example of the concrete structure of the first relaxation part.

FIG. 26 shows another example of a concrete structure of first relaxation part 62. When first relaxation part 62 is to be provided to first substrate part 12 or second substrate part 14, first substrate part 12 or second substrate part 14 can be elastically displaced along the plane perpendicular to first axis 38, by forming one hole 68 on first substrate part 12 or second substrate part 14, as first relaxation part 62.

Figure 27:
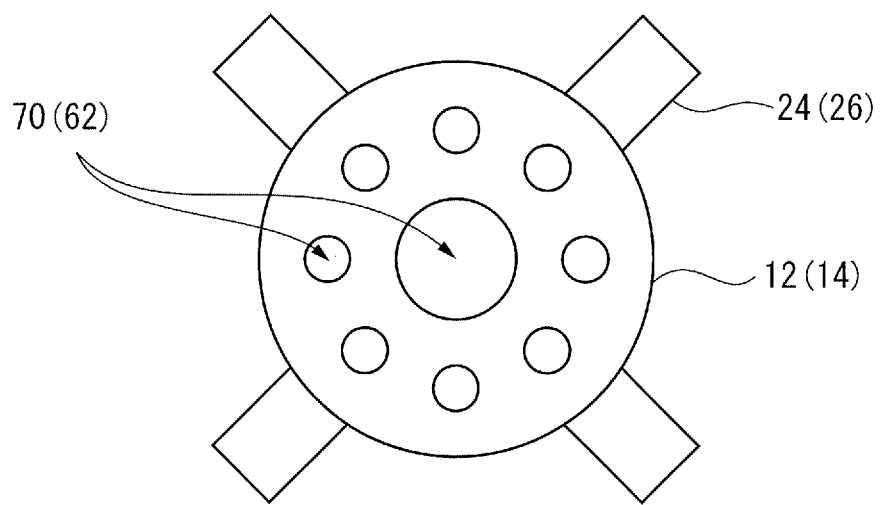
FIG. 27 shows a further example of the concrete structure of the first relaxation part.

FIG. 27 shows a further example of a concrete structure of first relaxation part 62. When first relaxation part 62 is to be provided to first substrate part 12 or second substrate part 14, first substrate part 12 or second substrate part 14 can be elastically displaced along the plane perpendicular to first axis 38, by forming a plurality of holes 70 on first substrate part 12 or second substrate part 14, as first relaxation part 62.

In either of FIGS. 25 to 27, by forming first relaxation part 62 as the hole(s) on at least one of first substrate part 12, second substrate part 14, first connection part 24 and second connection part 26, which are formed by a metal plate, etc., the heat generated within the force sensor can be easily dissipated. Further, when first relaxation part 62 is formed as the hole, it is preferable that the portion around the hole have an appropriate width, thickness and rigidity, in order that the external force and heat are easily transmitted to or through first substrate part 12 and second substrate part 14.

Next, second relaxation part 64 is elastically deformable along first axis 38, in order to relax or absorb the deformation of the member due to heat within the force sensor. Further, second relaxation part 64 has a relaxation mechanism for facilitating heat transfer and dissipating heat. Therefore, in case that the relative displacement between second substrate part 14 and third substrate part 16 may occur due to the factor (such as internal heat generation) other than the external force applied to the force sensor, an error of the relative displacement between second substrate part 14 and third substrate part 16 detected by second detection part 36 can be reduced, by providing second relaxation part 64 to at least one of second substrate part 14, second connection part 26, third substrate part 16 and third connection part 28.

For example, as shown in FIG. 24, in case that the relative displacement between second substrate part 14 and third substrate part 16 may occur or exist by the deformation of third substrate part 16 and third connection part 28 due to increase in temperature within force sensor 10 by heat from the heating element such as printed circuit board 60 within force sensor 10, it is preferable that second relaxation part 64 be provided to third connection part 28.

Figure 28:
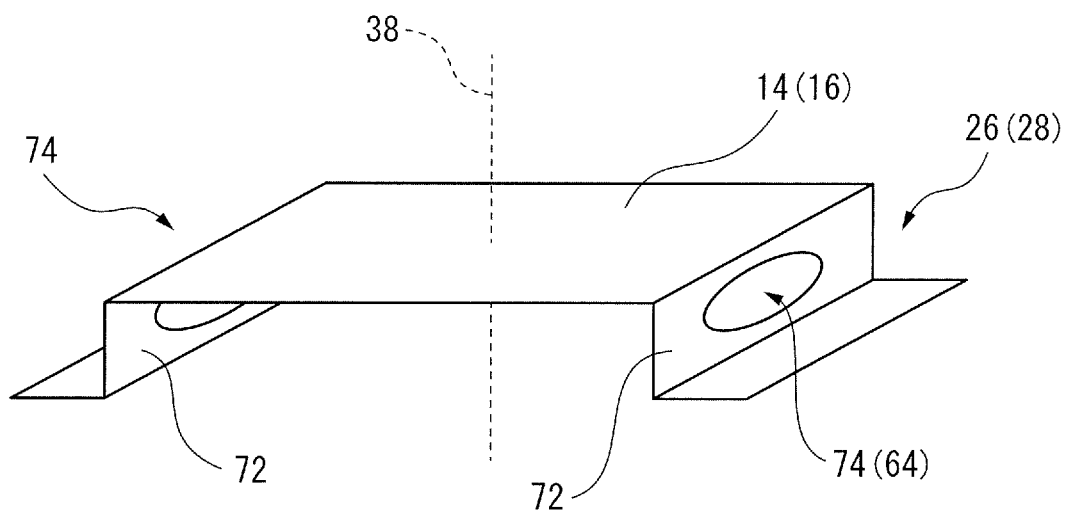
FIG. 28 shows an example of a concrete structure of a second relaxation part.

FIG. 28 shows an example of a concrete structure of second relaxation part 64. When second relaxation part 64 is to be provided to second connection part 26 or third connection part 28, a tab portion 72 extending along first axis 38 may be provided to second connection part 26 or third connection part 28, and at least one hole 74 may be formed on tab portion 72 as second relaxation part 64. By virtue of this, second substrate part 14 or third substrate part 16 can be elastically displaced along first axis 38.

Figure 29:
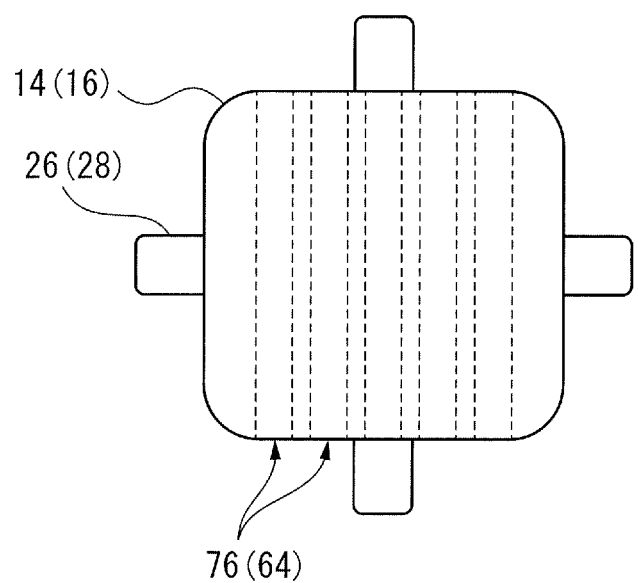
FIG. 29 shows another example of the concrete structure of the second relaxation part.
Figure 30:
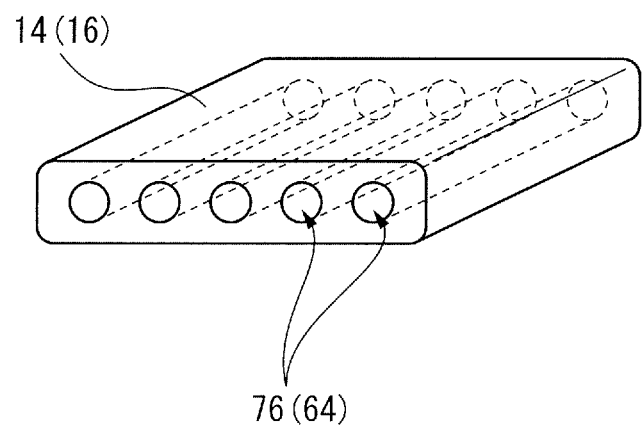
FIG. 30 shows the second relaxation part of FIG. 29 viewed from a different angle.

FIGS. 29 and 30 show another example of a concrete structure of second relaxation part 64. When second relaxation part 64 is to be provided to second substrate part 14 or third substrate part 16, second substrate part 14 or third substrate part 16 can be elastically displaced along first axis 38, by forming a plurality of through holes 76 in second substrate part 14 or third substrate part 16 as second relaxation part 64, wherein each through hole 76 extends parallel to the plane perpendicular to first axis 38. In this case, the function of first relaxation part 62, with respect to the direction which is parallel to the plane perpendicular to first axis 38 and is perpendicular to an axis of through hole 76, can also be realized. In addition, in FIG. 30 and FIG. 31 as described below, second connection part 26 and third connection part 28 are not illustrated.

Figure 31:
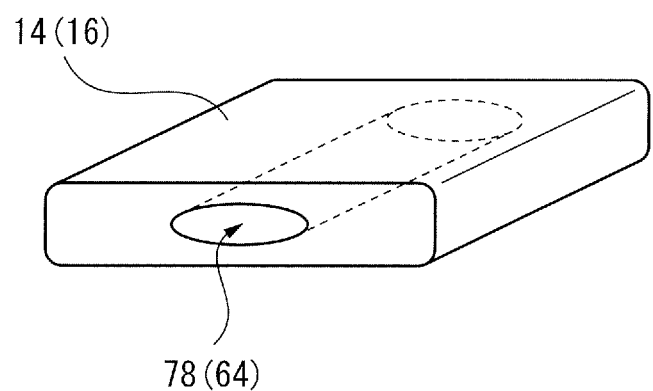
FIG. 31 shows a further example of the concrete structure of the second relaxation part.

FIG. 31 shows a further example of a concrete structure of second relaxation part 64. When second relaxation part 64 is to be provided to second substrate part 14 or third substrate part 16, second substrate part 14 or third substrate part 16 can be elastically displaced along first axis 38, by forming one through hole 78 in second substrate part 14 or third substrate part 16, as second relaxation part 64, wherein through hole 78 extends parallel to the plane perpendicular to first axis 38. In this case, the function of first relaxation part 62, with respect to the direction which is parallel to the plane perpendicular to first axis 38 and is perpendicular to an axis of through hole 78, can also be realized. In this regard, when a cross-sectional shape of the hole is oval, elastic flexibility of in the direction parallel to first axis 38 can be changed relative to elastic flexibility of in the direction which is parallel to the plane perpendicular to first axis 38 and is perpendicular to the axis of through hole 78.

In either of FIGS. 28 to 31, by forming second relaxation part 64 as the hole(s) on at least one of second substrate part 14, third substrate part 16, second connection part 26 and third connection part 28, which are formed by a metal plate, etc., the heat generated within the force sensor can be easily dissipated. Further, when second relaxation part 64 is formed as the hole, it is preferable that the portion around the hole have an appropriate width, thickness and rigidity, in order that the external force and heat are easily transmitted to or through second substrate part 14 and third substrate part 16.

Figure 32:
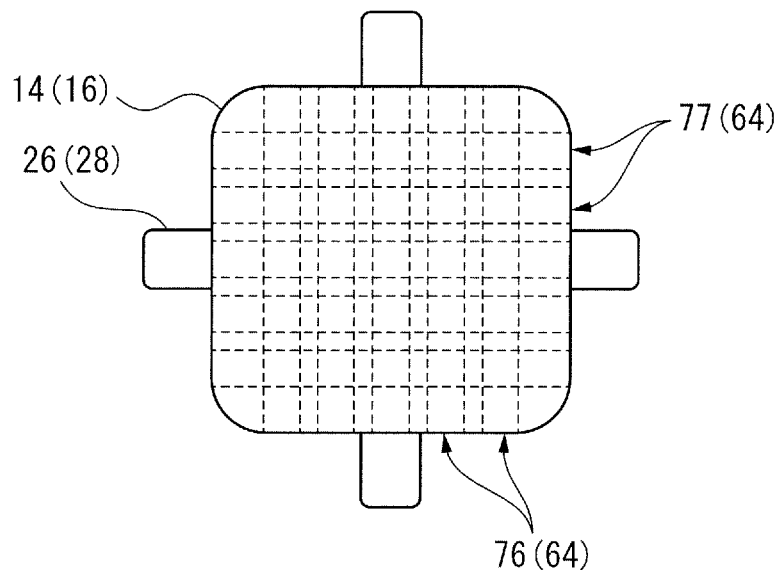
FIG. 32 shows a still further example of the concrete structure of the second relaxation part.
Figure 33:
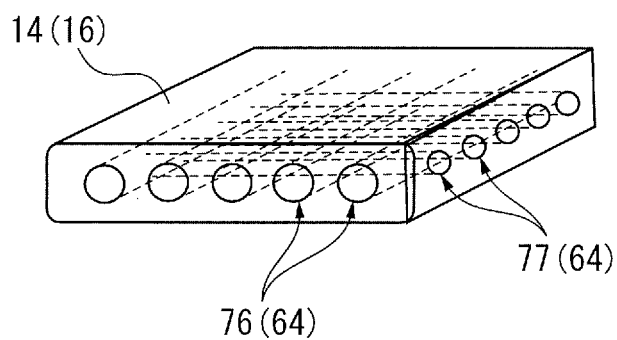
FIG. 33 shows the second relaxation part of FIG. 32 viewed from a different angle.

FIGS. 32 and 33 show a still further example of a concrete structure of second relaxation part 64. Similarly to FIGS. 29 and 30, as second relaxation part 64, a plurality of through holes 76, each extending parallel to the plane perpendicular to first axis 38, are formed in second substrate part 14 or third substrate part 16, and further, a plurality of through holes 77, each extending perpendicular to the axis of through hole 76 are formed in second substrate part 14 or third substrate part 16. By virtue of this, second substrate part 14 or third substrate part 16 can be elastically displaced along first axis 38. Also, the function of first relaxation part 62, with respect to the directions orthogonal to each other and parallel to the plane perpendicular to first axis 38, can also be realized. In this regard, when a cross-sectional shape of the through hole is oval and a length ratio of major and minor axes of the oval may be changed, elastic flexibility of in the direction parallel to first axis 38 can be changed relative to elastic flexibility of in the direction which is parallel to the plane perpendicular to first axis 38 and is perpendicular to the respective axes of through holes 76 and 77.

Figure 34:
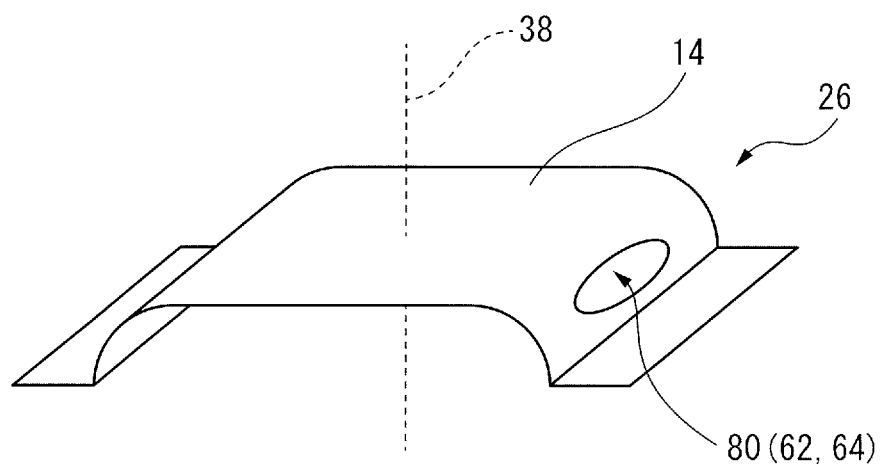
FIG. 34 shows an example of a structure having both functions of the first and second relaxation parts.

FIG. 34 shows an example of a structure having both functions of the first and second relaxation parts. When second connection part 26 has an arch-shaped portion and one or more hole 80 is formed on the arch-shaped portion, second substrate part 14 can be elastically displaced in either the direction along the plane perpendicular to first axis 38 or the direction along first axis 38.

Figure 35:
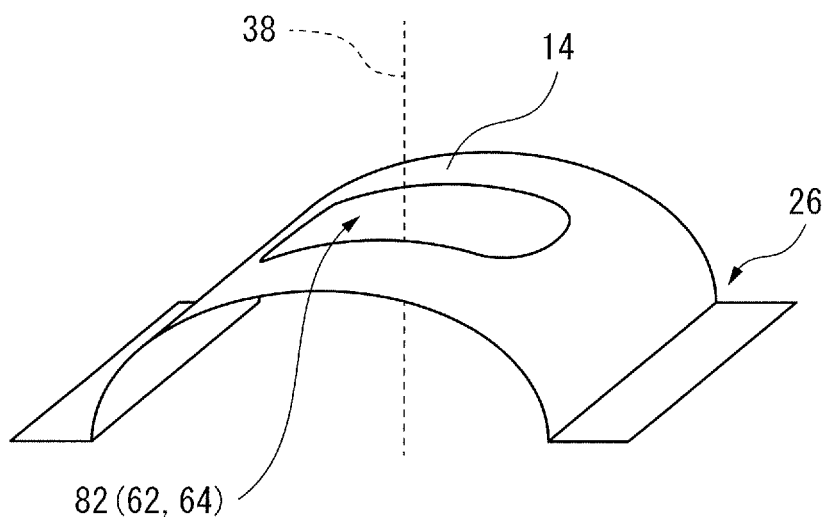
FIG. 35 shows another example of the structure having both functions of the first and second relaxation parts.
Figure 36:
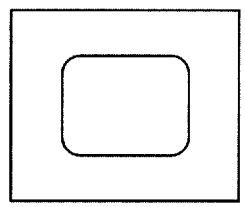
FIG. 36 shows an example of a shape of a hole of the first or second relaxation part.
Figure 37:
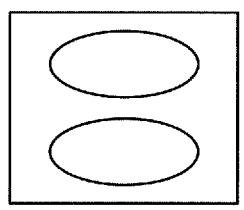
FIG. 37 shows an example of the shape of the hole of the first or second relaxation part.
Figure 38:
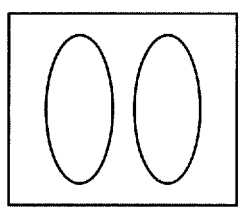
FIG. 38 shows an example of the shape of the hole of the first or second relaxation part.
Figure 39:
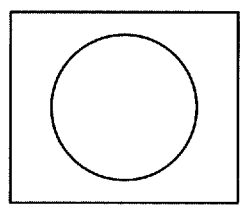
FIG. 39 shows an example of the shape of the hole of the first or second relaxation part.
Figure 40:
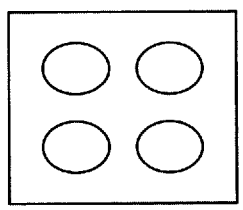
FIG. 40 shows an example of the shape of the hole of the first or second relaxation part.

FIG. 35 shows another example of a structure having both functions of the first and second relaxation parts. When second substrate part 14 has an arch-shaped portion and one or more hole 82 is formed on the arch-shaped portion, second substrate part 14 can be elastically displaced in either the direction along the plane perpendicular to first axis 38 or the direction along first axis 38.

As explained above, in the embodiments of the present disclosure, it is preferable that "the first relaxation part, which is elastically deformable along the plane perpendicular to the first axis, is provided to the portion of at least one of the first substrate part, the first connection part, the second substrate part and the second connection part," or "the second relaxation part, which is elastically deformable along the first axis, is provided to the portion of at least one of the second substrate part, the second connection part, the third substrate part and the third connection part," or "the first relaxation part, which is elastically deformable along the plane perpendicular to the first axis, is provided to the portion of at least one of the first substrate part, the first connection part, the second substrate part and the second connection part; and the second relaxation part, which is elastically deformable along the first axis, is provided to the portion of at least one of the second substrate part, the second connection part, the third substrate part and the third connection part."

In order that the relaxation part, such as first relaxation part 62 or second relaxation part 64, has the structure configured to be deformable in the predetermined direction and dissipate heat, it is preferable that the relaxation part have one or more hole (e.g., a through hole, a bottomed hole, an indent, a concave shape or a cavity). For example, FIG. 25 shows that one connection part has one rectangular hole 66. However, the rectangular hole may be replaced with one or more hole as shown in FIGS. 36 to 40. In this regard, one or more hole having the simple shape as shown in FIGS. 36 to 40, or one or more hole having a complicated curved shape may be formed in or on first relaxation part 62 and second relaxation part 64. Further, it is preferable that, in the relaxation part, a frame portion in the vicinity of the hole have an appropriate width, thickness, etc., so as to facilitate heat transfer, heat diffusion and heat dissipation.

Alternatively, as shown in FIG. 1, first connection part 24 or second connection part 26 may be manufactured from elastically deformable material such as rubber, so that first connection part 24 or second connection part 26 may also have the function of first relaxation part 62 or second relaxation part 64.

Figure 41:
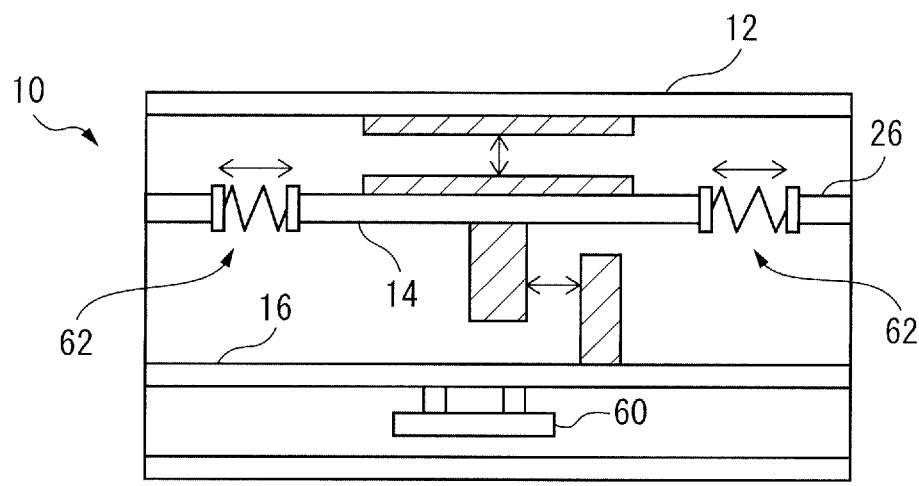
FIG. 41 shows an example in which the first relaxation part is provided to the force sensor having the printed circuit board.
Figure 42:
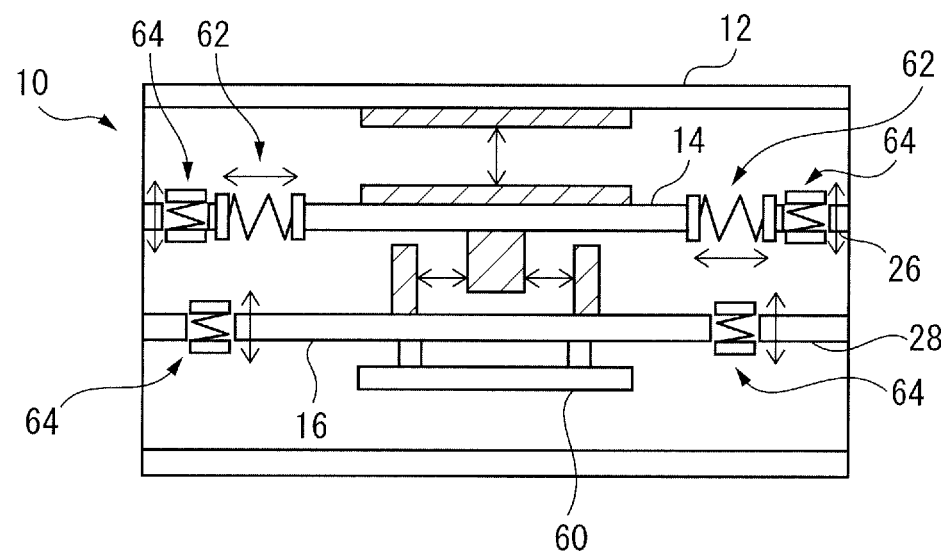
FIG. 42 shows an example in which the first and second relaxation parts are provided to the force sensor having the printed circuit board.
Figure 43:
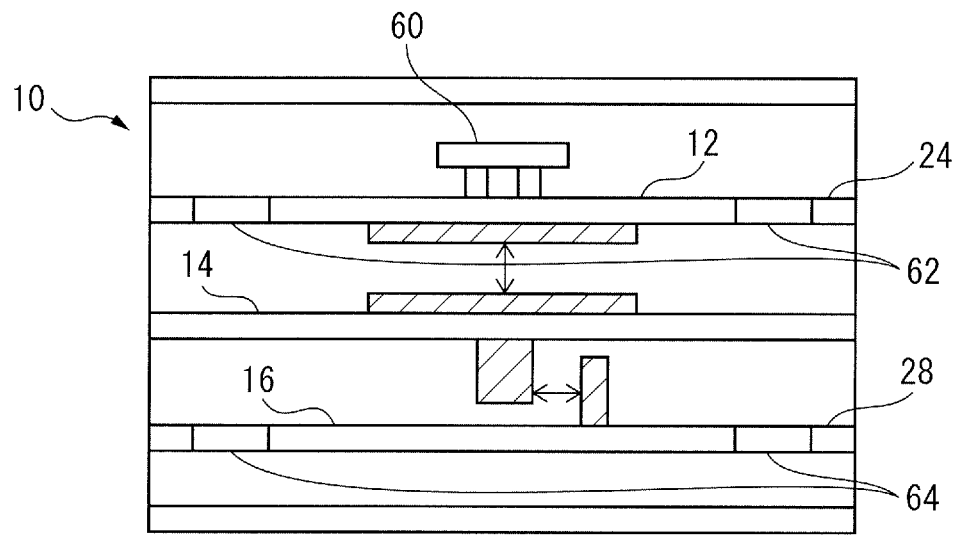
FIG. 43 shows another example in which the first and second relaxation parts are provided to the force sensor having the printed circuit board.

FIGS. 41 to 43 show variations of FIG. 24, in which locations of printed circuit board 60, first relaxation part 62 and second relaxation part 64 are properly changed. In the force sensor of FIG. 41, printed circuit board 60 is attached to a lower side of third substrate part 16, and functions as the heating element. Also, force sensor 10 of FIG. 41 has first relaxation part 62 provided to second connection part 26, and does not have the second relaxation part.

In the force sensor of FIG. 42, printed circuit board 60 is attached to a lower side of third substrate part 16, and functions as the heating element. Also, in force sensor 10 of FIG. 42, first relaxation part 62 and second relaxation part 64 are provided to second connection part 26, and second relaxation part 64 is also provided to third connection part 28.

In the force sensor of FIG. 43, printed circuit board 60 is attached to an upper side of first substrate part 12, and functions as the heating element. Also, in force sensor 10 of FIG. 43, first relaxation part 62 is provided to first connection part 24, and second relaxation part 64 is provided to third connection part 28. As such, the numbers and locations of first relaxation part 62 and second relaxation part 64 may be properly determined or changed, depending on the size and/or location of printed circuit board 60, and/or the configuration of the force sensor (e.g., the presence or absence of the housing, and the structures of the first and second detection parts, etc.).

Figure 44:
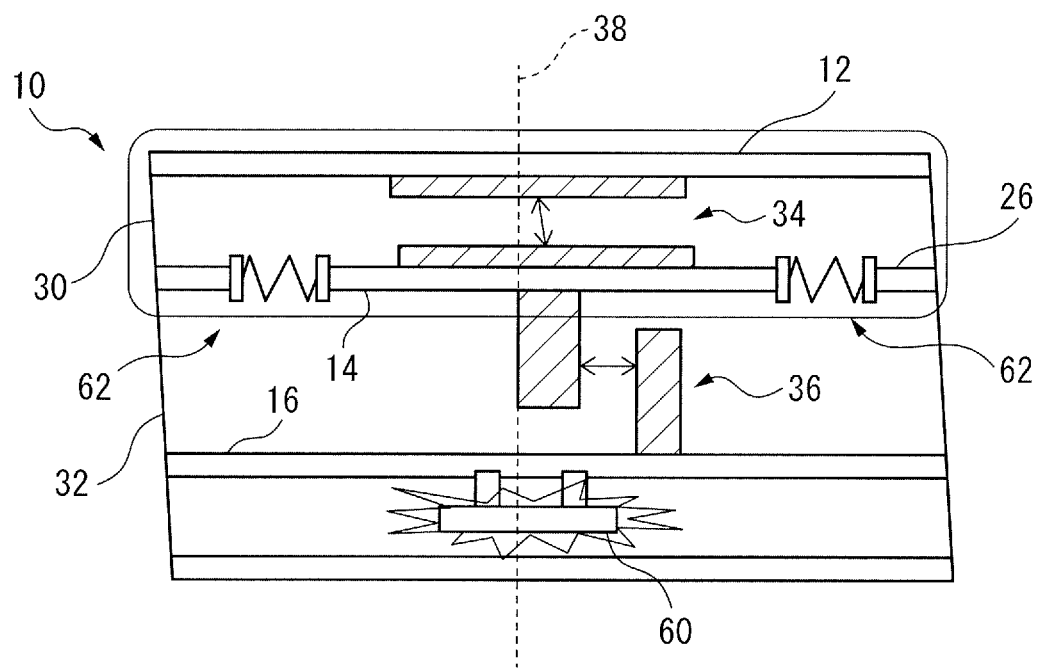
FIG. 44 explains function and effect of the first relaxation part in the force sensor according to the first embodiment.
Figure 45:
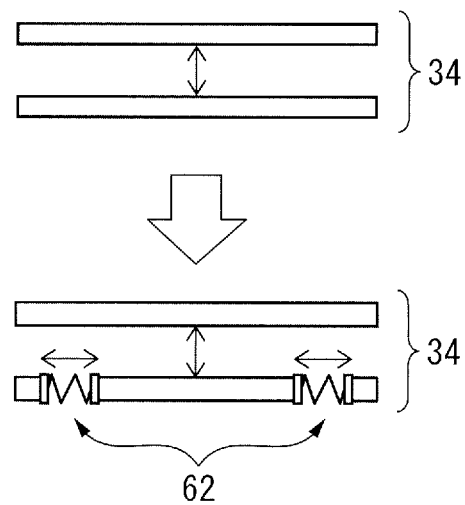
FIG. 45 is an enlarged view of the first detection part in the force sensor of FIG. 44.
Figure 46:
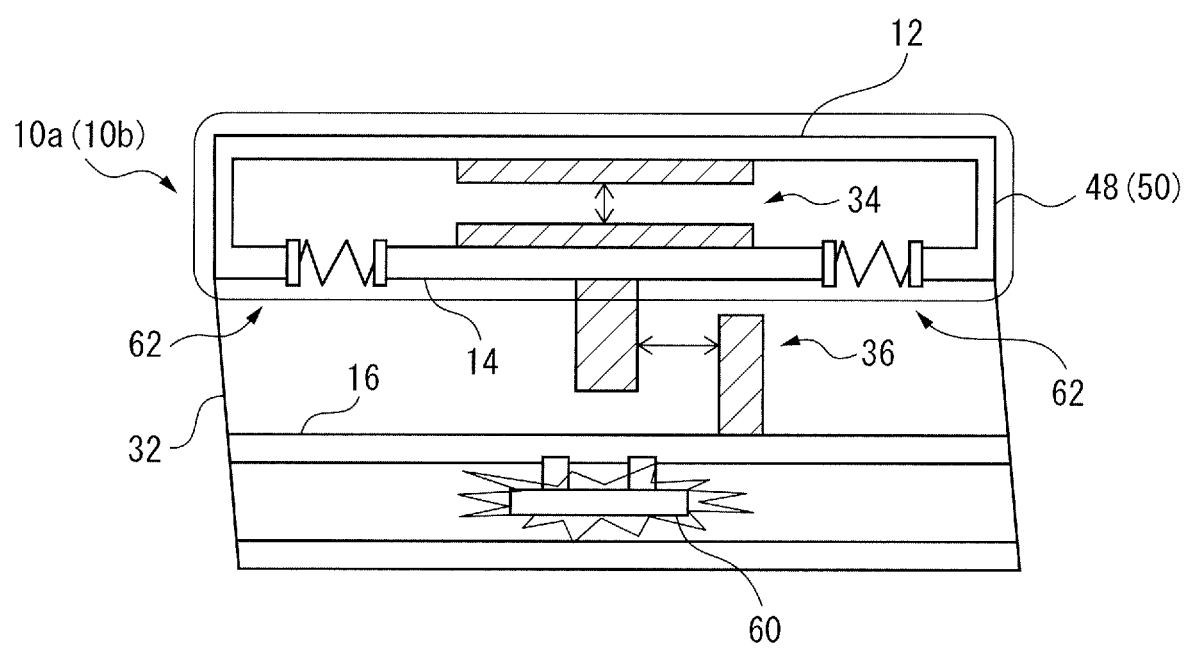
FIG. 46 explains function and effect of the first relaxation part in the force sensor according to the second or third embodiment.

FIGS. 44 to 46 explain the function and effect of the relaxation mechanism of the present disclosure. As explained with reference to FIGS. 22 and 23, in the conventional force sensor having no relaxation mechanism, due to heat dissipation from the heating element such as the printed circuit board, the member constituting the first detection part or the second detection part may be deformed, whereby the force applied to the force sensor may not be correctly detected.

To the contrary, as shown in FIG. 44, in force sensor 10 having first relaxation part 62, even when the member such as second substrate part 14 is bent or deformed due to the heat from the heating element such as the printed circuit board, first relaxation part 62 dissipates the heat and relax the deformation of the member by being elastically deformed in the appropriate direction, as shown in FIG. 45. Therefore, the displacement in the direction to be measured by first detection part 34 can be correctly detected.

Similarly, as shown in FIG. 46, also in force sensor 10*a* or 10*b* in which the first bridge part, the second bridge part and the first column part are integrated with each other, the measurement accuracy of first detection part 34 can be improved by arranging first relaxation part 62.

In the examples of FIGS. 44 and 46, first relaxation part 62 is provided to second connection part 26, so as to reduce the measurement error in first detection part 34 due to the deformation of second substrate part 14.

In the example of FIG. 42, second relaxation part 64 is provided to second connection part 26 and third connection part 28, whereas second relaxation part 64 may be provided to second substrate part 14, second connection part 26, third substrate part 16 and third connection part 28. In this case, even when the member constituting first detection part 34 and/or second detection part 36 is deformed due to the heat dissipation from the heating element such as the printed circuit board within the force sensor, second relaxation part 64 dissipates the heat and relax the deformation of the member by being elastically deformed in the appropriate direction, similarly to first relaxation part 62. Therefore, the displacements in the directions to be measured by first detection part 34 and second detection part 36 can be correctly detected, whereby the measurement accuracy of first detection part 34 and second detection part 36 can be improved.

In force sensor 10, first column part 30 and second column part 32 are elastically deformed, while second column part 32 is elastically deformed in force sensor 10*a* or 10*b*. Since the displacement between the electrodes due to the deformation of the column part is larger than the displacement between electrodes due to first relaxation part 62, first detection part 34 and second detection part 36 are usually not subject to an adverse effect by the deformation of first relaxation part 62. Otherwise, in order that the measurement accuracy of first detection part 34 and second detection part 36 is not subject to the above adverse effect, it is preferable that the displacement between the electrodes due to the deformation of first column part 30 and second column part 32 be enlarged relative to the displacement between electrodes due to first relaxation part 62, or that areas of the electrodes of first detection part 34 and second detection part 36 be enlarged.

In force sensor 10, first column part 30 and second column part 32 are elastically deformed, while second column part 32 is elastically deformed in force sensor 10*a* or 10*b*. Since the displacement between the electrodes due to the deformation of the column part is larger than the displacement between electrodes due to second relaxation part 64, first detection part 34 and second detection part 36 are usually not subject to an adverse effect by the deformation of second relaxation part 64. Otherwise, in order that the measurement accuracy of first detection part 34 and second detection part 36 is not subject to the above adverse effect, it is preferable that the displacement between the electrodes due to the deformation of first column part 30 and second column part 32 be enlarged relative to the displacement between electrodes due to second relaxation part 64, or that areas of the electrodes of first detection part 34 and second detection part 36 be enlarged.

In the example of FIGS. 44 to 46, second connection part 26 is provided with first relaxation part 62, which has the relaxation mechanism configured to be elastically deformable along the plane perpendicular to first axis 38. The similar function and effect are obtained when second substrate part 14 is provided with first relaxation part 62. When first relaxation part 62 is provided to first substrate part 12 and first connection part 24, the detection error of the relative displacement between first substrate part 12 and second substrate part 14, due to the deformation of first substrate part 12 by the factor (such as heat) other than the external force, can be reduced. When first relaxation part 62 is provided to second substrate part 14 and second connection part 26, the detection error of the relative displacement between first substrate part 12 and second substrate part 14, due to the deformation of second substrate part 14 by the factor (such as heat) other than the external force, can be reduced. In addition, when first relaxation part 62 is provided to first substrate part 12 and first connection part 24, another first relaxation part 62 may be provided to second substrate part 14 and second connection part 26.

Similarly, when second relaxation part 64 is provided to second substrate part 14 and second connection part 26, the detection error of the relative displacement between second substrate part 14 and third substrate part 16, due to the deformation of second substrate part 14 by the factor (such as heat) other than the external force, can be reduced. When second relaxation part 64 is provided to third substrate part 16 and third connection part 28, the detection error of the relative displacement between second substrate part 14 and third substrate part 16, due to the deformation of third substrate part 16 by the factor (such as heat) other than the external force, can be reduced.

As explained above, by arranging at least one of: first relaxation part 62 provided to at least one of first substrate part 12, first connection part 24, second substrate part 14 and second connection part 26; and second relaxation part 64 provided to at least one of second substrate part 14, second connection part 26, third substrate part 16 and third connection part 28, the detection error of first detection part 34 or second detection part 36 due to the factor such as heat other than the external force can be reduced, whereby the measurement accuracy of the force sensor can be improved.

According to the present disclosure, the deformation or displacement of the member of the force sensor due to the factor other than the external force can be reduced or relaxed, and thus the error between the detected force and the net force can be reduced.

While the invention has been described with reference to specific embodiments chosen for the purpose of illustration, it should be apparent that numerous modifications could be made thereto, by a person skilled in the art, without departing from the basic concept and scope of the invention.

The invention claimed is:

1. A force sensor, comprising:
   a first substrate part;
   a second substrate part positioned separately from the first substrate part;
   a third substrate part positioned separately from the second substrate part;
   a first bridge part configured to position the first substrate part;
   a second bridge part configured to position the second substrate part;
   a third bridge part configured to position the third substrate part;
   a first connection part configured to connect the first substrate part to the first bridge part;
   a second connection part configured to connect the second substrate part to the second bridge part;
   a third connection part configured to connect the third substrate part to the third bridge part;
   a first column part configured to connect the first bridge part to the second bridge part;
   a second column part configured to connect the second bridge part to the third bridge part;
   a first detection part configured to detect a relative displacement between the first substrate part and the second substrate part; and
   a second detection part configured to detect a relative displacement between the second substrate part and the third substrate part,
   wherein at least one of the first substrate part and the first connection part is configured to be elastically deformable,
   wherein the second column part is configured to be elastically deformable,
   wherein the first detection part configured to detect a first detection value which varies corresponding to at least one of: relative movement along a first axis between the first substrate part and the second substrate part; and relative rotation about a center axis along a plane perpendicular to the first axis between the first substrate part and the second substrate part,
   wherein the second detection part configured to detect a second detection value which varies corresponding to at least one of: relative movement along a plane perpendicular to the first axis between the second substrate part and the third substrate part; and relative rotation about a center axis along the first axis between the second substrate part and the third substrate part, and
   wherein the force sensor comprises at least one of:
   at least one first relaxation part elastically deformable along a plane perpendicular to the first axis, and provided to at least one of the first substrate part, the first connection part, the second substrate part and the second connection part; and
   at least one second relaxation part elastically deformable along the first axis, and provided to at least one of the second substrate part, the second connection part, the third substrate part and the third connection part.

2. The force sensor as set forth in claim 1, wherein the first detection value detected by the first detection part is a value for obtaining a force component in a direction of the first axis, a moment component of a force about a second axis orthogonal to the first axis, and a moment component of a force about a third axis orthogonal to both the first axis and the second axis, and
   wherein the second detection value detected by the second detection part is a value for obtaining a force component in a direction of the second axis, a force component in a direction of the third axis, and a moment component of a force about the first axis.

3. The force sensor as set forth in claim 1, wherein the first substrate part has two or more first connection parts extending along the plane perpendicular to the first axis, and
   wherein, when a force is applied to the force sensor, each first connection part is elastically deformed so as to generate at least one of: the relative movement along the first axis between the first substrate part and the second substrate part; and the relative rotation about the center axis along the plane perpendicular to the first axis between the first substrate part and the second substrate part.

4. The force sensor as set forth in claim 1, wherein the second substrate part has two or more second column parts extending along the first axis, and
   wherein, when a force is applied to the force sensor, each second column part is elastically deformed so as to generate at least one of: the relative movement along the plane perpendicular to the first axis between the second substrate part and the third substrate part; and the relative rotation about the center axis along the first axis between the second substrate part and the third substrate part.

5. The force sensor as set forth in claim 1, wherein the first column part has a structure integrated with the first bridge part and the second bridge part.

6. The force sensor as set forth in claim 1, wherein the first relaxation part has one or more hole formed on at least one of the first substrate part, the first connection part, the second substrate part and the second connection part.

7. The force sensor as set forth in claim 1, wherein the second relaxation part has one or more hole formed on at least one of the second substrate part, the second connection part, the third substrate part and the third connection part.

8. The force sensor as set forth in claim 1, wherein the first detection value represents a change in an electrostatic capacitance which varies depending on a relative displacement between the first substrate part and the second substrate part.

9. The force sensor as set forth in claim 1, wherein the second detection value represents a change in an electrostatic capacitance which varies depending on a relative displacement between the second substrate part and the third substrate part.

10. The force sensor as set forth in claim 1, wherein the force sensor further comprises:
- a detection value acquirement part configured to acquire the values detected by the first detection part and the second detection part; and
- a printed circuit board on which the detection value acquirement part is mounted.

11. The force sensor as set forth in claim 1, wherein the force sensor further comprises: a force calculation part configured to, based on the first detection value and the second detection value, calculate the force components in directions of three axes orthogonal to each other, and the moment component of the force about each of the three axes.

* * * * *